(12) United States Patent
Fuller

(10) Patent No.: US 12,048,930 B2
(45) Date of Patent: Jul. 30, 2024

(54) HEATER FOR APPARATUS FOR DETECTING MOLECULE(S)

(71) Applicant: Ubiquitome Limited, Auckland (NZ)

(72) Inventor: Graeme Colin Fuller, Auckland (NZ)

(73) Assignee: Ubiquitome Limited (NZ)

( * ) Notice: Subject to any disclaimer, the term of this patent is extended or adjusted under 35 U.S.C. 154(b) by 861 days.

(21) Appl. No.: 17/059,640

(22) PCT Filed: May 31, 2019

(86) PCT No.: PCT/NZ2019/050061
§ 371 (c)(1),
(2) Date: Nov. 30, 2020

(87) PCT Pub. No.: WO2019/231339
PCT Pub. Date: Dec. 5, 2019

(65) Prior Publication Data
US 2021/0283614 A1  Sep. 16, 2021

(30) Foreign Application Priority Data

Jun. 1, 2018  (NZ) ........................................ 743115
Oct. 16, 2018  (NZ) ........................................ 747328

(51) Int. Cl.
*B01L 7/00*   (2006.01)
*B01L 3/00*   (2006.01)
(Continued)

(52) U.S. Cl.
CPC ............. *B01L 7/52* (2013.01); *B01L 3/50853* (2013.01); *B01L 7/00* (2013.01); *B01L 9/06* (2013.01); *B01L 9/523* (2013.01); *G01N 21/0332* (2013.01); *G05D 23/1917* (2013.01); *G05D 23/24* (2013.01); *H05B 3/267* (2013.01); *H05B 3/84* (2013.01); *H05K 1/0212* (2013.01); *H05K 1/0274* (2013.01); *B01L 2200/147* (2013.01); *B01L 2300/045* (2013.01); *B01L 2300/0663* (2013.01); *B01L 2300/168* (2013.01); *B01L 2300/1822* (2013.01);
(Continued)

(58) Field of Classification Search
CPC ... H05B 3/10; H05B 3/18; H05B 3/28; H05B 3/283; H05B 3/286
See application file for complete search history.

(56) References Cited

U.S. PATENT DOCUMENTS

2008/0000892 A1  1/2008  Hirano et al.
2011/0136109 A1  6/2011  Drechsler et al.
2015/0111287 A1  4/2015  Rawle

*Primary Examiner* — Samuel C Woolwine
(74) *Attorney, Agent, or Firm* — Morriss O'Bryant; Compagni Cannon, PLLC.

(57) ABSTRACT

A heater (22) for heating a substantially transparent or translucent cover of a reaction vessel. The heater has a board (80) having a front face, an opposing back face, and an aperture (1062) through which an excitation beam can pass into a reaction vessel via a cover of the reaction vessel, and/or through which reaction light can pass from the reaction vessel via the cover. A thermally conductive, heat-spreading layer (86) radiates heat towards the cover, the heat-spreading layer being arranged on the front face of the board that is arranged to face the cover. At least one heating element outputs heat to the heat-spreading layer (86), the heating element being arranged on the back face of the board that is arranged to face away from the cover. The heat-spreading layer (86) is in thermal communication with the heating element by at least one heating via 82 through the board.

20 Claims, 14 Drawing Sheets

(51) Int. Cl.
    *B01L 9/00*       (2006.01)
    *B01L 9/06*       (2006.01)
    *G01N 21/03*      (2006.01)
    *G05D 23/19*      (2006.01)
    *G05D 23/24*      (2006.01)
    *H05B 3/26*       (2006.01)
    *H05B 3/84*       (2006.01)
    *H05K 1/02*       (2006.01)
    *G01N 21/64*      (2006.01)

(52) U.S. Cl.
    CPC ............ *B01L 2300/1827* (2013.01); *B01L 2300/1844* (2013.01); *B01L 2300/1894* (2013.01); *G01N 21/6452* (2013.01); *G01N 2201/0221* (2013.01); *H05B 2203/005* (2013.01); *H05B 2203/013* (2013.01); *H05K 2201/10022* (2013.01); *H05K 2201/10151* (2013.01)

HEATER FOR APPARATUS FOR DETECTING MOLECULE(S)

FIELD OF THE INVENTION

This present invention relates to a heater for heating a substantially transparent or translucent cover of a reaction vessel in apparatus for detecting molecule(s). In embodiments, the heater may be configured to heat one or more covers of a plurality of reaction vessels in a portable device for detecting molecule(s).

BACKGROUND

Systems and methods for detecting molecule(s) are known. These systems and methods may be used, for example, for one or more of: amplification and detection of nucleic acids, including analysis of polymerase chain reactions (such as quantitative polymerase chain reactions); protein analysis; ligand analysis; and fluorescence analysis of chemical reactions.

Amplification of nucleic acids can be performed using quantitative polymerase chain reaction (Q-PCR) analysis. Generally, for a Q-PCR analysis, the temperature of a sample within a reaction vessel is repeatedly cycled between a higher temperature at which the template DNA is denatured, and a lower temperature at which the primers in the sample anneal to a targeted DNA sequence and the DNA replicates. This thermal cycling may be repeated up to 40 times until the DNA in the sample is amplified or replicated sufficiently to enable detection of a fluorescing reagent dye bound to the DNA.

Proteins within a sample can be detected through antibody binding approaches. Fluorescently labelled antibodies can be mixed with a sample and the protein-antibody complexes captured. Presence of florescence indicates the presence of the protein in the sample.

Detection of metabolites can also be performed. A sample is mixed with a reporter dye. The metabolite in the sample either directly or indirectly converts the reporter to a fluorescent dye in proportion to the amount of metabolite in the original sample.

The Q-PCR method is described generally in U.S. Pat. No. 5,994,056 (Higuchi), entitled 'Homogenous methods for nucleic acid amplification and detection'. This document discloses a method for detecting amplification by exposing the reaction mixture to ultraviolet light and detecting fluorescence of ethidium bromide fluorescent dye using a spectra fluorometer.

Various apparatuses for performing Q-PCR analysis, protein analysis, or ligand analysis are commercially available and used in laboratories to amplify and quantify a targeted molecule.

Such apparatuses generally include some form of thermal block adapted to receive at least one reaction vessel containing a reaction mixture including the sample, heating/cooling means thermally coupled to the thermal block, excitation means for exciting the reaction mixture, and detection means for optically detecting fluorescence of a reagent dye bound to target in the reaction mixture, in response to the excitation.

Each reaction vessel is generally sealed/covered by a substantially transparent cover to prevent the sample within the reaction vessel from escaping the reaction vessel during the amplification processes, while still allowing excitation radiation from an excitation source to enter into the reaction vessel and allowing a fluorescence from the reaction vessel to be detected. During the heating and cooling processes, the sample within the reaction vessel may evaporate and condense on the cover of the reaction vessel. The evaporation and condensation of the sample mixture on the cover of the reaction vessel interferes with the optical path of the radiation beam into the reaction vessel and of the fluorescence from the sample within the reaction vessel. The condensation also starves the chemical reaction of its components changing the fidelity of the assay. Further, temperature errors and variations can inhibit the desired reactions from properly occurring, increasing the dwell times at any temperature and slowing the total PCR cycle time. The optical interference, changes to assay performance and temperatures errors and variations reduces the accuracy and efficiency of the detection.

Accordingly, apparatuses for performing Q-PCR analysis may also include a reaction vessel cover heater through which an excitation beam and/or reaction light may pass. The cover heater heats the cover of the reaction vessel to inhibit the sample from evaporating and condensing on the covers of the reaction vessel during the heating and cooling processes.

Existing apparatuses for performing Q-PCR analysis are generally designed exclusively for use in a laboratory environment, and may be adapted to thermally cycle a large array of samples (for example, in 96 or more reaction vessels or wells as in a microtiter plate) at the same time. As a result, these apparatuses are generally relatively large, heavy, and inefficient in terms of power use, in particular when analysing only a small number of samples. These apparatuses are also commonly expensive and/or complex.

An embodiment of the present invention seeks to provide a heater for heating a substantially transparent or translucent cover of a reaction vessel to address the formation of condensation on the cover.

In this specification where reference has been made to patent specifications, other external documents, or other sources of information, this is generally for the purpose of providing a context for discussing the features of the invention. Unless specifically stated otherwise, reference to such external documents or such sources of information is not to be construed as an admission that such documents or such sources of information, in any jurisdiction, are prior art or form part of the common general knowledge in the art.

SUMMARY OF THE INVENTION

A first aspect of the present invention provides a heater for heating a substantially transparent or translucent cover of a reaction vessel, the heater comprising:
  a board having a front face and an opposing back face, and having an aperture through which an excitation beam can pass into a reaction vessel via a cover of the reaction vessel, and/or through which reaction light can pass from the reaction vessel via the cover; and
  a thermally conductive, heat-spreading layer configured to radiate heat towards a cover of a reaction vessel, the heat-spreading layer being arranged on the front face of the board that is arranged to face the cover; and
  at least one heating element configured to output heat to the heat-spreading layer, the heating element being arranged on the back face of the board that is arranged to face away from the cover of a reaction vessel;
  the heat-spreading layer being in thermal communication with the heating element by at least one heating via through the board.

In an embodiment, the heater comprises:
  at least one temperature-sensing element configured to sense the temperature at or near one or more locations on the front face of the board, the temperature-sensing element being arranged on the back face of the board;
  the temperature-sensing element being in thermal communication with the one or more locations on the front face of the board by at least one sensing via through the board.

In an embodiment, the heater comprises:
  a thermally conductive temperature-sensing member arranged on the front face of the board, the temperature-sensing member being in thermal communication with the temperature-sensing element by the sensing via;
  wherein the one or more locations on the front face correspond to one or more locations on the temperature-sensing member.

In an embodiment, the temperature-sensing member is substantially thermally insulated from the heat-spreading layer to at least inhibit thermal transfer via conduction between the member and the layer.

In an embodiment, a surface of the heat-spreading layer that is oriented to face the cover, a surface of the temperature-sensing member that is oriented to face the cover, or each of the surface of the heat-spreading layer that is oriented to face the cover and the surface of the temperature-sensing member that is oriented to face the cover, is substantially planar.

In an embodiment, the heat-spreading layer, the temperature-sensing member, or each of the heat-spreading layer and the temperature-sensing member, comprises a thermally conductive material arranged on, or applied to or formed on the board.

In an embodiment, the heat-spreading layer, the temperature-sensing member, or each of the heat-spreading layer and the temperature-sensing member, comprises copper, such as copper foil.

In an embodiment, the heat-spreading layer, the temperature-sensing member, or each of the heat-spreading layer and the temperature-sensing member, has a thickness of greater than or about 17.5 µm, greater than or about 35 µm, greater than or about 70 µm, or about 70 µm.

In an embodiment, the temperature-sensing element comprises a thermally sensitive resistor, wherein the resistance of the resistor is dependent on, and changes in response to changes in, temperature.

In an embodiment, the temperature-sensing element comprises a platinum resistance temperature detector or a thermistor.

In an embodiment, the temperature-sensing element comprises a temperature measuring integrated circuit.

In an embodiment, the heating element comprises a resistor.

In an embodiment, the heating element is located adjacent, at or near the aperture.

In an embodiment, the board is a printed circuit board.

In an embodiment, the board comprises fibreglass, such as FR-4 glass epoxy.

In an embodiment, the board has a glass-transition temperature ($T_g$) that is greater than or equal to about 120° C., greater than or equal to about 130° C., greater than or equal to about 140° C., or greater than or equal to about 150° C.

In an embodiment, the board has a thickness of about 0.2 mm to about 2.3 mm, about 0.4 mm to about 2.0 mm, about 0.5 mm to about 1.6 mm, about 0.6 mm to about 1.6 mm, about 0.8 mm to about 1.5 mm, about 1.0 mm to about 1.5 mm, or about 1.2 mm.

In an embodiment, the or each via is at least partly filled with a thermally conductive material.

In an embodiment, the thermally conductive material comprises copper.

In an embodiment, the heat-spreading layer comprises a plurality of heat-spreading sections configured to radiate heat towards a cover of a reaction vessel, each heat-spreading section being arranged on a corresponding section on the front face of the board;
  the at least one heating element comprises, for each heat-spreading section, at least one respective heating element configured to output heat to the heat-spreading section, the heating element being arranged on the back face of the board;
  each heat-spreading section being in thermal communication with the respective heating element by at least one respective heating via through the board; and
  the heating element(s) of at least one section of the plurality of sections are independently controlled or controllable relative to the heating element(s) of one or more of the other section(s) to independently control the temperature of the at least one heat-spreading section relative to the one or more other heat-spreading sections.

In an embodiment, each heat-spreading section is substantially thermally insulated from another heat-spreading section(s) to at least inhibit thermal transfer by conduction between the each heat-spreading section and another heat-spreading section(s).

A second aspect of the present invention provides an apparatus for detecting molecule(s), the apparatus comprising:
  a reaction vessel holder for receipt of at least one reaction vessel; and
  a heater according to the first aspect of the present invention.

A third aspect of the present invention provides an apparatus for detecting molecule(s), the apparatus comprising:
  a heater according to the first aspect of the present invention; and
  a controller coupled to the heating element(s) and configured to control the heat output of the heating element(s) based at least partly on the sensed temperature(s).

In an embodiment, the controller is configured to independently control the heating element(s) of one or more sections of the heat-spreading layer relative to the heating element(s) of one or more of the other section(s) based at least partly on the sensed temperature(s).

In an embodiment, the apparatus comprises:
  at least one substantially transparent or translucent cover for a reaction vessel;
  wherein the apparatus is arranged so that the front face of the board is located about 1 mm to about 3 mm, about 1.5 mm to about 2.5 mm, or about 2 mm, from the cover.

In another embodiment, the apparatus is arranged so that the front face of the board is located about 0 to about 1 mm from the cover.

In an embodiment, the apparatus is a portable apparatus.

The term 'comprising' as used in this specification means 'consisting at least in part of'. When interpreting statements in this specification which include the term 'comprising', other features besides the features prefaced by this term in each statement can also be present. Related terms such as 'comprise' and 'comprised' are to be interpreted in a similar manner.

It is intended that reference to a range of numbers disclosed herein (for example, 1 to 10) also incorporates reference to all rational numbers within that range (for example, 1, 1.1, 2, 3, 3.9, 4, 5, 6, 6.5, 7, 8, 9 and 10) and also any range of rational numbers within that range (for example, 2 to 8, 1.5 to 5.5 and 3.1 to 4.7) and, therefore, all sub-ranges of all ranges expressly disclosed herein are hereby expressly disclosed. These are only examples of what is specifically intended and all possible combinations of numerical values between the lowest value and the highest value enumerated are to be considered to be expressly stated in this application in a similar manner.

This invention may also be said broadly to consist in the parts, elements and features referred to or indicated in the specification of the application, individually or collectively, and any or all combinations of any two or more said parts, elements or features.

To those skilled in the art to which the invention relates, many changes in construction and widely differing embodiments and applications of the invention will suggest themselves without departing from the scope of the invention as defined in the appended claims. The disclosures and the descriptions herein are purely illustrative and are not intended to be in any sense limiting. Where specific integers are mentioned herein which have known equivalents in the art to which this invention relates, such known equivalents are deemed to be incorporated herein as if individually set forth.

As used herein the term '(s)' following a noun means the plural and/or singular form of that noun.

As used herein the term 'and/or' means 'and' or 'or', or where the context allows both.

The invention consists in the foregoing and also envisages constructions of which the following gives examples only.

BRIEF DESCRIPTION OF THE DRAWINGS

The present invention will now be described, by way of non-limiting example only, with reference to the accompanying drawings, in which.

DETAILED DESCRIPTION

Figure 1:
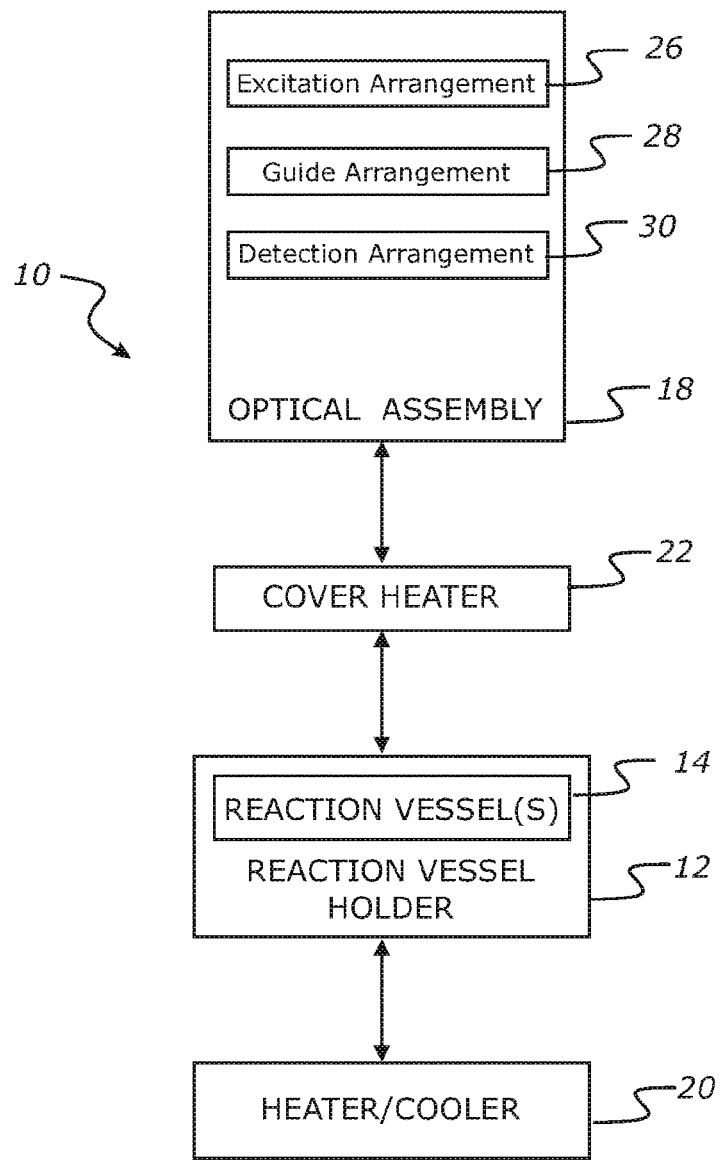
FIG. 1 is a general block diagram of a device for detecting molecule(s) according to an embodiment of the present invention.

Embodiments of the present invention relate to a reaction vessel cover heater for heating a substantially transparent or translucent cover of a reaction vessel in apparatus for detecting molecule(s).

In an embodiment, the apparatus is a relatively compact, handheld portable device 10 (see FIGS. 14 and 15) for detecting molecule(s) that may be used 'in the field'. That is, outside the laboratory environment. Alternatively, in another embodiment, the apparatus may be a larger, or otherwise normally immobile or stationary, device designed to be kept and used in the same location. For example, within a laboratory environment.

The device 10 may be suitable or configured for amplification and detection of nucleic acids in a sample. For example, the device 10 could be used for polymerase chain reaction (PCR) analysis (including quantitative PCR analysis). The device 10 may additionally or alternatively be suitable or configured for one or more of: protein analysis, ligand analysis, or fluorescence analysis from any chemical reaction for example. Further, the device 10 may be used for detecting molecule(s) within a single reaction vessel, or in a plurality of samples from the same or different sources within a plurality of reaction vessels.

Device for Detecting Molecule(s)

A device 10 for detecting molecule(s) is schematically shown in FIGS. 1-5. The device 10 generally comprises a reaction vessel holder 12 for receiving one or more reaction vessels 14, which each contain a sample 16, an optical assembly 18, a heater/cooler (or heat exchange device) 20, at least one reaction vessel cover heater 22, and a controller 24 (FIG. 5) for controlling the various functions of the device 10. The optical assembly 18 comprises at least one excitation arrangement 26, at least one guide arrangement 28 and at least one detection arrangement 30.

Reaction Vessel

Figure 2:
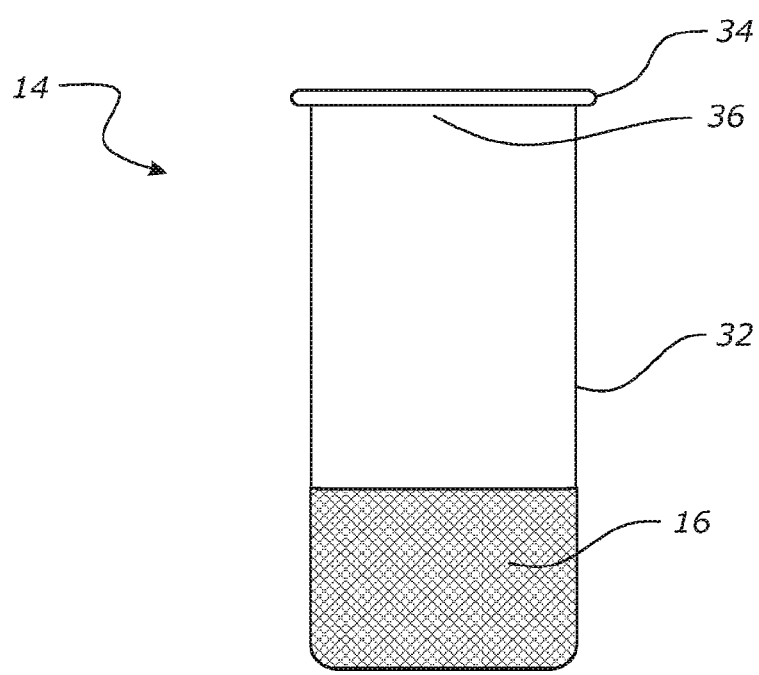
FIG. 2 is a schematic cross-sectional side view of a reaction vessel of the device of FIG. 1.

An example reaction vessel or tube 14 containing a sample 16 to be analysed is shown in FIG. 2. The reaction vessel 14 comprises a tubular body 32, and a removable cover (or cap or lens) 34. The body 32 defines an interior volume for holding a sample 16 and has a mouth 36 at one end for receiving the sample 16 into the volume. The body 32 may have any suitable shape, for example a conical tube or cylindrical tube (as shown in FIG. 2). The cover 34 is used to substantially seal the mouth 36 of the body 32 to avoid the sample 16 from evaporating outside the reaction vessel 14 when heated by the heater/cooler 20, which could disrupt the analysis, and could contaminate the device 10 and affect future results. The cover 34 may be a separate component from the body 32 of the reaction vessel 14. For example, the cover 34 may be a thin transparent sheet or film, or cap or lens, that covers the mouth 36 of one or more reaction vessels 14. Alternatively, the cover or cap 34 may be, for example, hingedly connected to the body 32. At least the cover 34 of the reaction vessel 14 is substantially transparent or translucent so that an optical path can be established between the sample 16 to be analysed and the optical assembly 18 (described below).

Reaction Vessel Holder

Figure 3:
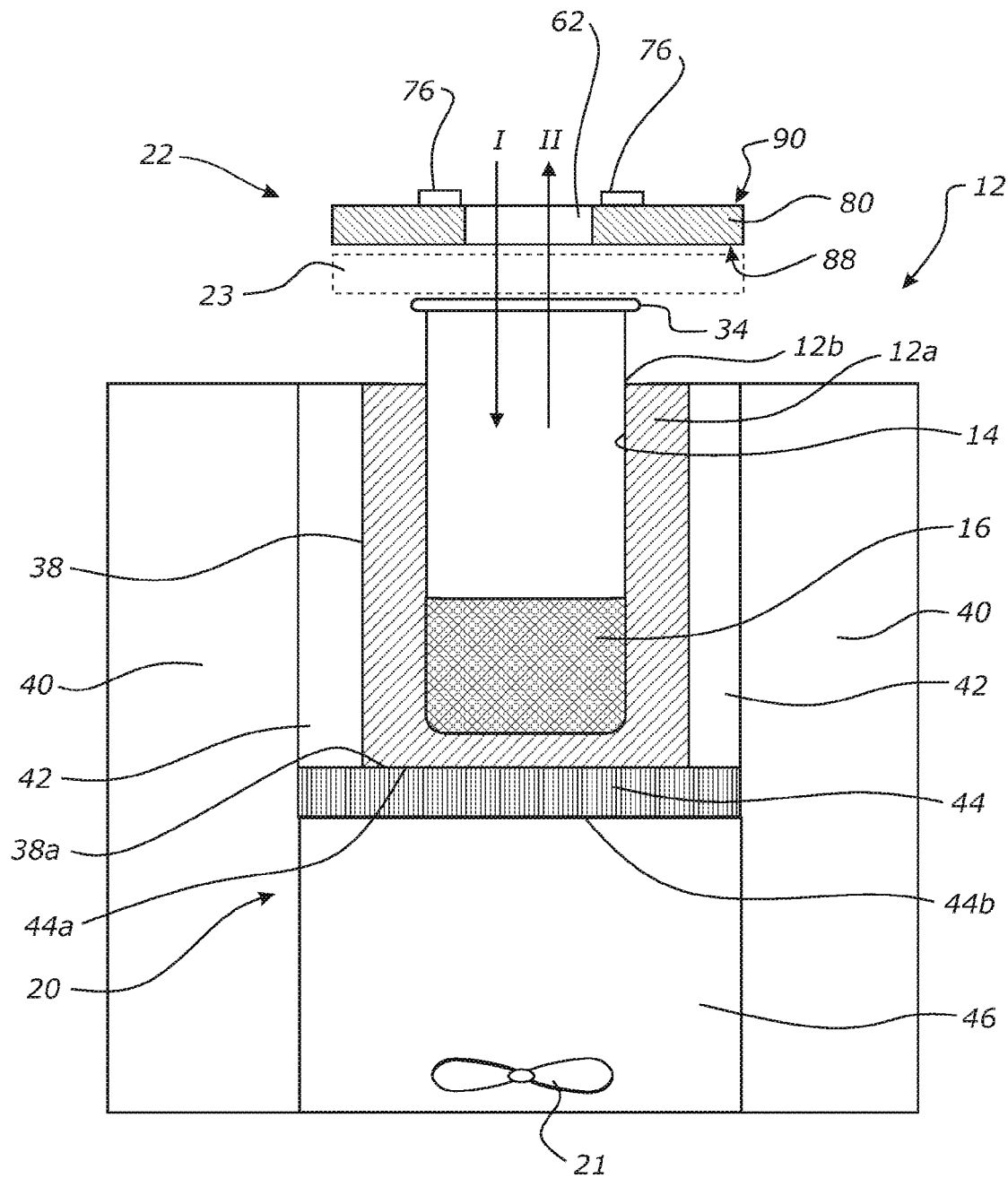
FIG. 3 is a schematic cross-sectional side view of a reaction vessel holder for receiving a reaction vessel, a reaction vessel, a heater/cooler for controlling the temperature of a sample within the reaction vessel, and a reaction vessel cover heater for heating a cover of the reaction vessel of the device of FIG. 1.

With reference to FIG. 3, the reaction vessel holder or block 12 is arranged to receive one or more reaction vessels 14. The reaction vessel holder 12 has one or more receptacles 38 for each receiving a reaction vessel 14. Although only a single receptacle 38 (and vessel 14) is shown in FIG. 3, the reaction vessel holder 12 will normally have a plurality of receptacles 38 for the simultaneous detection of molecules in a plurality of samples in a plurality of reaction vessels 14. The vessels 14 of the plurality of reaction vessels 14 may be separately or integrally formed.

The reaction vessel holder 12 has a generally tubular body 12a for supporting the similarly shaped reaction vessel 14, and a mouth 12b for receiving the vessel 14. When the reaction vessel 14 is placed into the receptacle 38, the top of the vessel 14 may project beyond the receptacle 38 (as shown in FIG. 3) to facilitate removal of the vessel 14 from the receptacle 38.

The reaction vessel holder 12 provides a thermal coupling between the heater/cooler 20 and the reaction vessel 14. The receptacle 38 is insulated from housing 40 of the device 10, such as by an insulative material that is generally indicated by the reference number 42. The insulative material at least inhibits, or frustrates, heat loss by inhibiting conduction between the vessel receptacle 38 and the housing 40. In one embodiment, the insulative material 42 comprises fibreglass, polystyrene, or similar material(s). In another embodiment, the insulative material 42 may be provided by an air gap, or gaps, between the vessel 14 and the housing 40 that insulates the vessel 14 from the housing 40.

The vessel receptacle 38 has a relatively high thermal conductivity and low thermal mass (that is, a relatively low heat capacity or relatively low specific heat capacity) to promote rapid and efficient heat transfer between the heater/cooler 20 and the vessel receptacle 38, and between the reaction vessel 14 and the vessel receptacle 38. The receptacle 38 may comprise or be copper.

Alternatively, the receptacle 38 may comprise or be one or more other materials having a relatively high thermal conductivity and low thermal mass, such as aluminium, gold and silver.

'Relatively high thermal conductivity', as used in this disclosure, means thermal conductivity of about 25 $Wm^{-1}K^{-1}$ or higher. In a further embodiment, the thermal conductivity of the vessel receptacle is about 285 $Wm^{-1}K^{-1}$ or higher. In a further embodiment, the thermal conductivity of the vessel receptacle is higher than about 1500 $Wm^{-1}K^{-1}$. In a further embodiment, the thermal conductivity of the vessel receptacle is between about 1800 $Wm^{-1}K^{-1}$ and about 2100 $Wm^{-1}K^{-1}$.

'Relatively low specific heat capacity', as used in this disclosure, means specific heat capacity of less than about 1.0 $Jg^{-1}K^{-1}$ at about 300K. In a further embodiment, the specific heat capacity of the vessel receptacle is less than about 0.8 $Jg^{-1}K^{-1}$ at about 300K. In a further embodiment, the specific heat capacity of the vessel receptacle is less than about 0.6 $Jg^{-1}K^{-1}$ at about 300K. In a further embodiment, the specific heat capacity of the vessel receptacle is about 0.418 $Jg^{-1}K^{-1}$.

In an embodiment, the mass of the vessel receptacle 38 is between about 1 g and about 20 g. In an embodiment, the mass of the vessel receptacle is between about 1 g and about 10 g. In an embodiment, the mass of the vessel receptacle is between about 1 g and about 5 g. In an embodiment, the mass of the vessel receptacle is between about 1 g and about 2.5 g. In an embodiment, the mass of the vessel receptacle is between about 1 g and about 2 g. In an embodiment, the mass of the vessel receptacle is about 1.9 g.

Heater/Cooler

The heater/cooler 20 is configured to rapidly heat and/or cool the sample in one or a plurality of stages. The heater comprises at least one thermoelectric cooling (TEC) (or Peltier) device 44 (FIG. 3), at least one heat sink 46, and at least one fan 21. A first side 44a of the TEC device 44 may be in direct physical contact with a base 38a of the vessel receptacle 38 for an efficient thermal coupling between the TEC device 44 and the receptacle 38. The heat sink 46 may, for example, comprise a metallic mass. The heat sink 46 dissipates heat from the second side 44b of the TEC device 44 when the sample 16 is cooled, and provides a source of heat when the sample 16 is heated. The fan is configured to actively dissipate excess heat from the heat sink 46.

Optical Assembly

Figure 4:
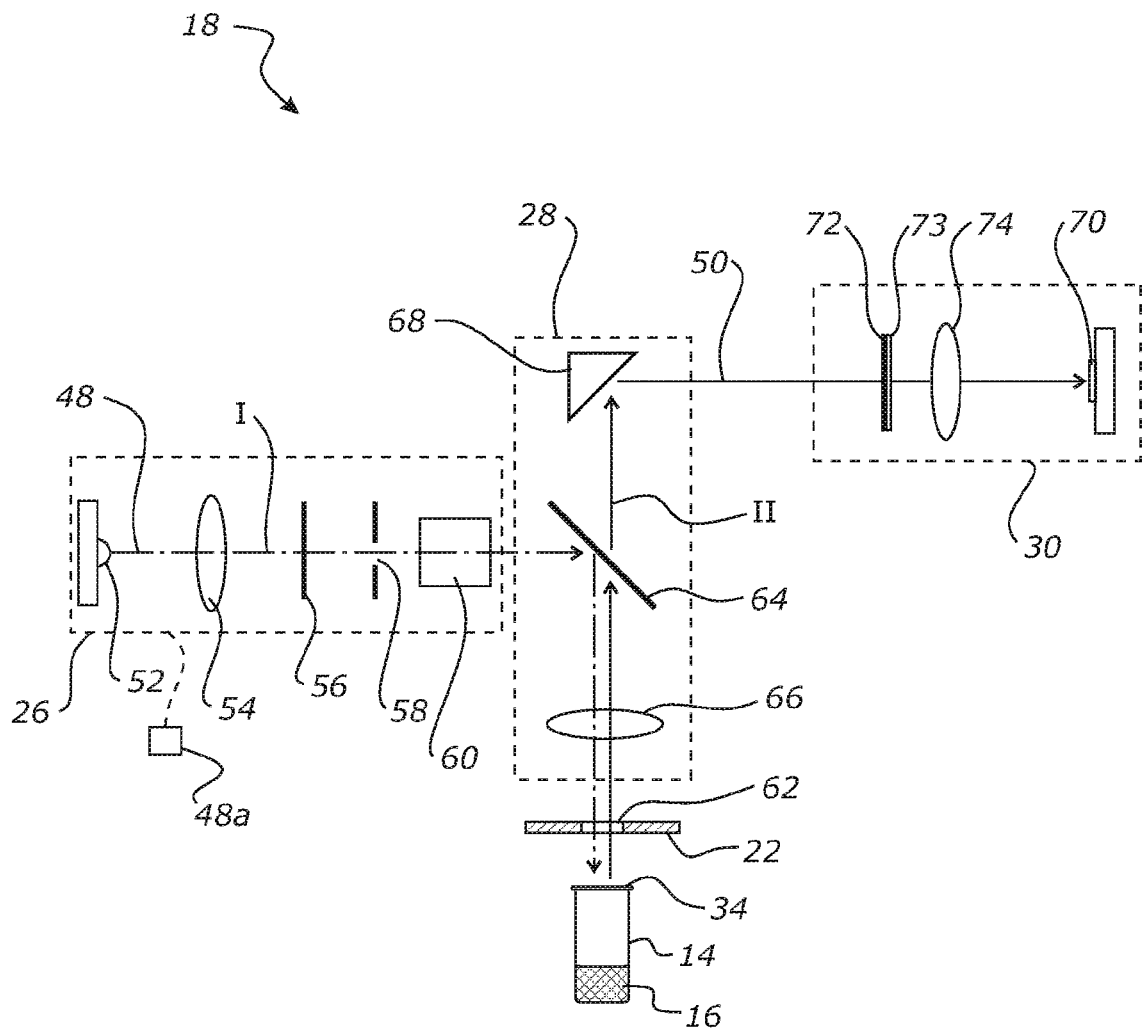
FIG. 4 a general schematic layout of the optical assembly of the device of FIG. 1.

With reference to FIG. 4, the optical assembly 18 is configured to generate and distribute one or more excitation radiation beams 48 to one or more samples 16 within one or more respective reaction vessels 14 retained by the reaction vessel holder 12, and to measure reaction light 50, such as fluorescence, from the sample(s) 16 within the vessel(s) 14. The excitation arrangement 26 is configured to generate the at least one radiation beam 48. The guide arrangement 28 is configured to guide the excitation beam 48 from the excitation arrangement 26, along an excitation path I, to the reaction vessel 14. The excitation beam 48 illuminates the sample within the vessel 14. Upon excitation by the beam 48, successful amplification of the target molecules (for example, DNA) results in fluorescence or omission of reaction light 50 at a wavelength (different from the wavelength of the excitation beam 48) from the sample 16 or a reporter dye. The guide arrangement 28 is further configured to guide reaction light 50 from the vessel 14, along a detection path II, to the detection arrangement 30.

The excitation arrangement 26 comprises one or more excitation sources 52. For example, the or each excitation source 52 may comprise or be a laser light source or a light emitting diode (LED). The excitation arrangement 26 may comprise a plurality of excitation sources 52, with each excitation source 52 configured to transmit a beam 48 at a same or different wavelength from the other excitation source(s) 52. The excitation beams 48 from the excitation sources 52 may be combined to form a single excitation beam 48. The use of a plurality of excitation wavelengths allows for a plurality of tests to be carried out on a sample 16, and enables the device 10 to measure fluorescent reporters at a plurality of different wavelengths. Alternatively, or additionally, the excitation arrangement 26 may comprise a plurality of excitation sources 52, with each excitation source 52 configured to transmit an excitation beam 48 to a respective vessel 14 along a respective beam path I. The excitation arrangement 26 may further comprise, and the beam 48 may pass through, for example, one or more collimating lenses 54, one or more attenuators/filters 56, an optical aperture 58, and/or a shroud 60 arranged to remove any stray light and reduce the diameter of the beam(s) 48, or combinations of such devices.

The guide arrangement 28 optically couples the excitation arrangement 26 with the reaction vessel 14 to guide the excitation beam 48 to the sample 16 through an aperture 62 of a reaction vessel cover heater 22 (discussed in further detail below), and through the substantially transparent or translucent cover 34 of the reaction vessel 14, to the sample 16. The guide arrangement 28 also optically couples the reaction vessel 14 with the detection arrangement 30 to guide reaction light 50 from the sample 16 through the cover 34 of the reaction vessel 14, and through the aperture 62 of the reaction vessel cover heater 22, to the detection arrangement 30.

The guide arrangement 28 comprises a filter element, in the form of at least one dichroic ('two colour') element 64, and a focusing/imaging lens 66. The dichroic element 64 is configured to be reflective for wavelength(s) of the excitation beam 48 from the excitation arrangement 26, and transmissive for wavelength(s) of reaction light 50 from the reaction vessel 14. A suitable dichroic element 64 can be selected depending on the wavelength(s) of the excitation beam 48 and the wavelength(s) of the reaction light 50. The dichroic element 64 directs the excitation beam 48 to the sample through an imaging lens 66, which images/focuses the excitation beam 48 from the dichroic element 64 into the vessel 14. Fluorescence of the dye (reaction light 50) that is emitted substantially coaxial with the vessel 14 passes substantially straight through the imaging lens 66 and the dichroic element 64, substantially without reflection. The lens 66 may be configured to collimate the reaction light 50.

The dichroic element 64 substantially blocks scattered excitation light from the reaction vessel 14 reaching the detection arrangement 30. The dichroic element 64 is oriented at about 45° to the excitation path I from the excitation arrangement 26, and at about 45° to the detection path II from the reaction vessel 14 so that the dichroic element 64 reflects the incident excitation beam 48 from the excitation source 52 at an angle of about 90° with respect to the incident beam 48 towards a longitudinal axis of the reaction vessel 14.

The guide arrangement 28 may optionally also include one or more turning or steering mirrors 68, such as a dielectric mirror that is highly reflective at the fluorescence wavelength, that folds or reflects the detection optical path II to direct the emitted fluorescence towards the detection arrangement 30. The mirror 68 is arranged at 45° relative to the detection path II from the dichroic element 64 to reflect the emitted fluorescence substantially orthogonally to the detection arrangement 30.

However, many other configurations of the excitation arrangement, the guide arrangement 28 and detection arrangement 30 are possible. In one alternative configuration, the dichroic element 64 may be transmissive at the wavelength(s) of the excitation beam 48 and reflective at the wavelength(s) of the reaction light 50. In one alternative configuration, the turning or steering mirror(s) 68 may be highly reflective at the excitation beam 48 wavelength(s). In such a configuration, the positions of the excitation arrangement 26 and detection arrangement 30 relative to the guide arrangement could be swapped. The excitation arrangement 26 and the detection arrangement 30 may each include one or more further steering mirrors to fold or reflect the excitation beam path I and the reaction light 50 path II, if necessary. That is, the excitation beam 48 and/or reaction light 50 may each be folded more than once. Each of the excitation arrangement 26 and the detection arrangement 30, for example, may not be arranged substantially orthogonally in the same plane with respect to the vessel receptacle 38 and the mirror 68. (The excitation arrangement 26 and the detection arrangement 30 are arranged substantially orthogonally in the same plane with respect to the receptacle 38 and the mirror 68 in FIG. 4).

In the arrangement shown in FIG. 4, both the excitation beam path I and the reaction light path II pass through an aperture 62 in the reaction vessel cover heater 22. In an alternative embodiment only one of (1) the excitation beam 48 path I and (ii) the reaction light path II may pass through an aperture 62 in the reaction vessel cover heater 22.

Figure 16:
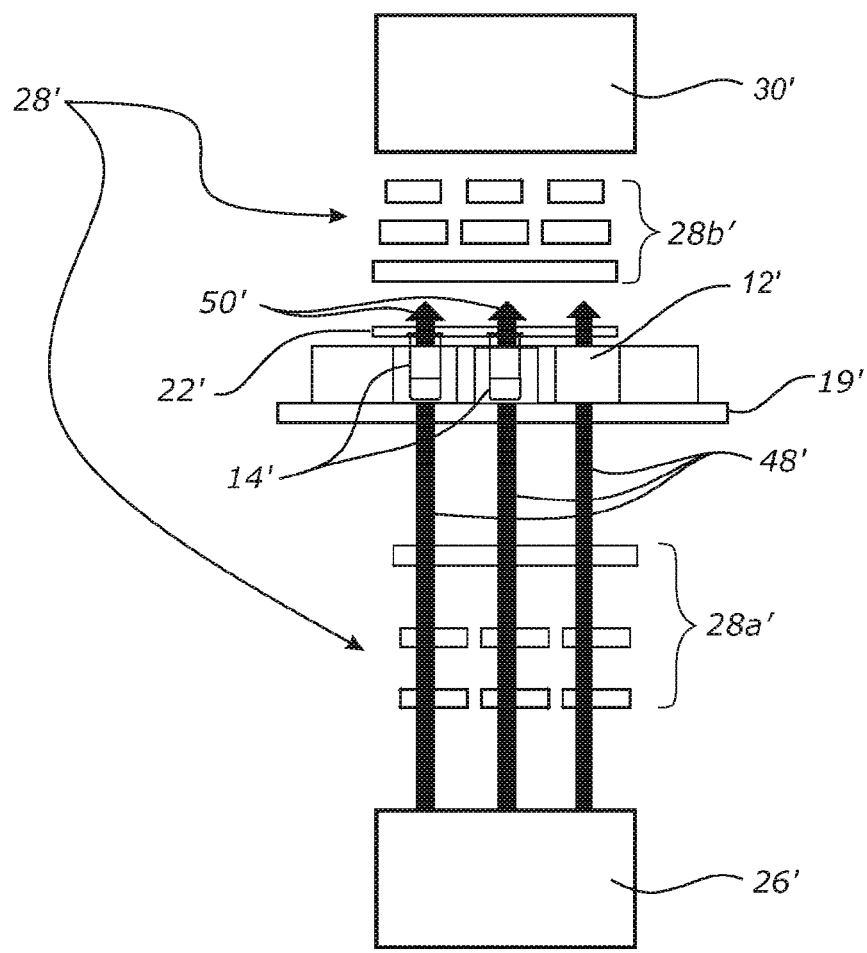
FIG. 16 is a general schematic layout of an alternative optical assembly of the device of FIG. 1.

In one embodiment shown in FIG. 16 (in which like reference numbers indicate like parts with the addition of a prime '), for example, the guide arrangement 28' may comprise a first filter element or filter element group 28a' and a second filter element or filter element group 28b' positioned on or facing opposite sides of the reaction vessel(s) 14' in the reaction vessel holder 12', wherein the reaction vessel(s) 14' (two of which are shown) is/are substantially optically transparent. For example, the first filter element or filter element group 28a' may face a bottom side of the reaction vessel 14', and the second filter element or filter element group 28b' may face a top side of the reaction vessel 14', or vice-versa.

The reaction vessel cover heater is provided above the reaction vessel 14'.

The first filter element or filter element group 28a' is configured to guide and pass a respective one of the excitation beams 48' along an excitation path from the excitation arrangement 26' into the reaction vessel 14'. The first filter element or filter element group 28a' is configured to pass the excitation beam 48' from the excitation arrangement 26' towards the reaction vessel 14' and to reflect the reaction light 50' from the reaction vessel 14'. The first filter element or filter element group 28a' may be configured to 'clean up' an excitation beam 48' from a semi-monochromatic excitation arrangement and/or to define an excitation bandwidth from a wide-band excitation arrangement and/or to collimate the excitation beam 48' as required.

The second filter element or filter element group 28b' is configured to guide reaction light 50' from the sample along a detection path towards the detector. The second filter element or filter element group 28b' is configured to pass the reaction light 50' from the reaction vessel 14' towards the detector and to attenuate or block the excitation beam.

The first filter element or filter element group 28a' and/or second filter element or filter element group 28b' may comprise a dichroic element and/or a glass filter.

Further, the first filter element or filter element group 28b' and/or second filter element or filter element group 28b' may be integral with the reaction vessel 14' or reaction vessel holder 12' that is substantially optically transparent. For example, a side of the reaction vessel holder 12' may be coated with a material that reflects the reaction light 50' while passing the excitation beam. The excitation optical path from the source 52' and the detection optical path from the reaction vessels 14' may be substantially parallel and not folded.

The reaction vessel holder 12' may comprise or be supported by an optically transparent plate 19' that is configured to facilitate thermal transfer between the heater/cooler 20 (e.g. as in FIG. 3) and the sample in the reaction vessel 14'.

The detection arrangement 30 (FIG. 4), 30' (FIG. 16) comprises one or more detectors 70, such as photodetector(s), configured to generate an electrical signal proportional to incident light intensity. The detection arrangement 30, 30' may further comprise, for example, a filter 72 to remove any noise (stray wavelengths), and an imaging lens 74 that images/focuses fluorescent light onto the detector 70. The detection arrangement 30, 30' may also comprise a bandpass filter (73) that is configured to pass reaction light 50 from sample fluorescence.

The detection arrangement 30 may comprise a plurality of detectors 70, for example, one detector 70 for each respective reaction vessel 14 in the device 10. Alternatively, the device 10 may comprise a plurality of detection arrangements 30, for example, one detection arrangement 30 for each respective reaction vessel 14.

Controller

The controller 24 for controlling various functions of the device 10 is configured to control the temperature profile of the vessel receptacle 38 to heat and cool the sample to various predetermined temperatures for specific periods of time, for example to amplify the nucleic acids in the sample. The required temperatures and periods are known to a person skilled in the relevant art. The controller 24 is configured to control (with feedback) the heater/cooler 20 for heating and cooling the reaction vessel(s) 14 and/or the fan(s) 21 to actively dissipate excess heat from the heat sink 46. The controller 24 is further configured to control the excitation arrangement 26 of the optical assembly 18 to generate the excitation beam(s) 48.

The controller 24 is further configured to receive measurements of detected reaction light 50 from the detection arrangement(s) 30. The controller 24 is further configured to control heating element(s) 76 of the reaction vessel cover heater 22 (discussed in further detail below) and to control the heat output by heating element(s) 76 based on feedback from temperature-sensing elements in the form of temperature sensors 78.

Figure 5:
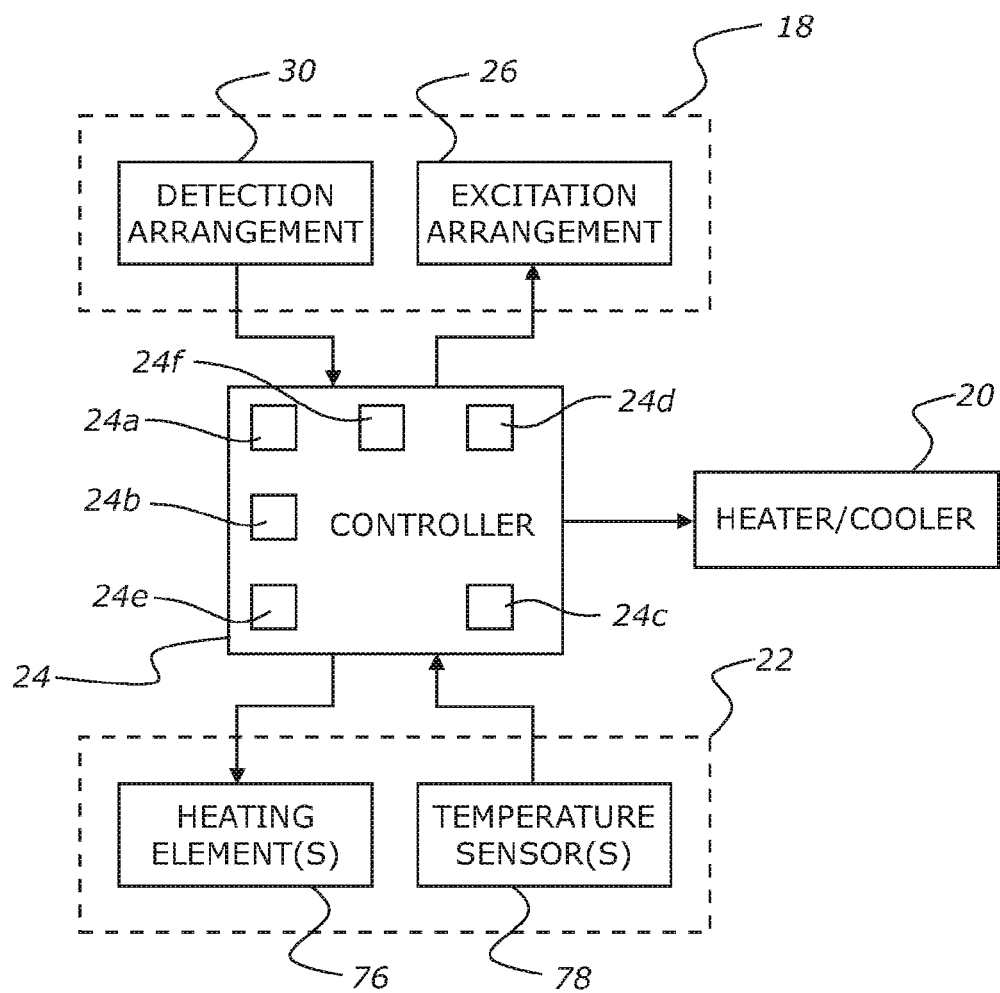
FIG. 5 is a general block diagram of the interaction between a controller of the device of FIG. 1 and other components of the device.

With reference to FIG. 5, the controller 24 may include, for example, a battery management module 24a for managing charging of a battery or batteries that may power the device 10; a power switch 24b for turning the device 10 on and/or off; a thermal management module 24c for sensing the internal temperature of the device 10 and controlling the fan to manage the temperature of the device 10; an excitation control module 24d for controlling activation of the excitation source 52; and a reaction vessel cover heater control module 24e for controlling the temperature of the reaction vessel cover heater 22.

The controller 24 may include a microcontroller 24f that is electrically and communicatively coupled to the excitation control module 24d and the reaction vessel cover heater 22 control module 24e by digital outputs to selectively activate the excitation source(s) 52 and the reaction vessel cover heater 22. The microcontroller 24f may also be also electrically and communicatively coupled to the fluorescence detector(s) 70 by analogue input(s) to receive an analogue signal indicative of the level of light received by the detectors 70. The microcontroller 24f may also be also electrically and communicatively coupled to one or more excitation beam 48 sensor(s) 48a (not shown) by analogue input(s) to monitor the intensity of the excitation beam(s) 48 and maintain the intensity of the beams 48 in a predetermined range. An analogue to digital converter (ADC) may be used to convert these signals to a digital value that is read, stored, and communicated by the microcontroller 24f to an external device through a USB or other suitable interface.

The controller 24 according to the embodiments of the present invention may be implemented purely in hardware consisting of one or more components which may include discrete electronic components or integrated circuits. Alternatively or additionally, the controller 24 of embodiments of the present invention may be implemented at least in part using programmable hardware components, such as programmable logic devices (PLDs) or field programmable gate arrays (FPGAs), or by software executed by a computing means or processor which may include the microcontroller or a general purpose personal computer (PC) programmed accordingly. Typically, however, the invention would be implemented as an embedded system using a combination of the aforementioned components, as described with respect to the embodiment of the invention. In particular, the functions of the controller 24 may be distributed among a number of integrated circuits of the embedded system, such as the TEC control, battery management module, thermal management module, LED control module, lens heater control module, and microcontroller, for example, but may alternatively be performed centrally by a single integrated or discrete circuit (such as microcontroller) without departing from the scope of the invention.

Reaction Vessel Cover Heater

A reaction vessel cover heater 22 (or lens or lid heater) for heating substantially transparent or translucent cover(s) (or lens(es) or lid(s)) 34 of the reaction vessel(s) 14 is shown in FIGS. 6-11. The reaction vessel cover heater 22 is configured to prevent the formation of condensation on the cover 34 of the reaction vessel 14, which may interfere with the optical signals of the excitation path I into, and detection path II, from the reaction vessel 14, and/or disrupt the reaction itself. The reaction vessel cover heater 22 achieves this by radiatively heating the cover 34. The reaction vessel cover heater 22 is configured to heat the cover(s) 34 of 16 reaction vessels. However, the reaction vessel cover heater 22 is scalable and may be configured accordingly to heat the cover(s) 34 of less or more reaction vessels.

The embodiment reaction vessel cover heater 22 is relatively compact, advantageously both thin and lightweight. The reaction vessel cover heater 22 is relatively energy efficient (low in power consumption) and has heat-transferring components of low thermal mass so able to rapidly attain target temperature(s), while still being capable of attaining and maintaining a temperature or temperature range(s) of the covers 34 at or near a desired level (for example, about 100° C. to within a few degrees).

The controller 24 is configured to actively maintain the temperature of the reaction vessel cover heater 22 within a required temperature interval so that the ambient temperature does not influence the actual heater temperature as the ambient temperature may do if a constant current were passed through the reaction vessel cover heater 22. In an embodiment, the controller 24 is also configured to use a switching scheme to efficiently regulate the average current through the reaction vessel cover heater 22 so as not to waste electrical energy in a dissipative sense (as may be the case with, for example, a linear type regulator).

The reaction vessel cover heater 22 comprises at least one board 80 having at least one aperture 62 through which an excitation beam 48 can pass into the reaction vessel 14 through the cover 34 of the vessel 14, and/or through which reaction light 50 can pass from the vessel 14 through the cover 34. The example reaction vessel cover heater 22 has 16 apertures 62 for 16 respective reaction vessels 14. Each aperture 62 allows the passage of an excitation beam 48 to, and reaction light 50 from, each respective reaction vessel 14. Depending on the configuration of the optical assembly 18, each aperture 62 may be located and mainly intended for passage there through of either (i) an excitation beam 48 from the excitation arrangement 26 through the aperture 62 to the respective reaction vessel 14 or (ii) reaction light 50 from the respective vessel 14/sample through the aperture 62 to detection arrangement 30.

The apertures 62 are uniformly arranged on the board 80 in two, parallel rows of eight apertures 62. However, in other embodiments, the apertures 62 may not be uniformly arranged and/or uniformly spaced apart. For example, the apertures 62 may not be arranged in parallel rows. The board 80 will normally have as many apertures 62 as the device 10 has receptacles 38 for vessels 14. Without limitation and for example only, alternatively, the board 80 may have 1, 4, 6, 12, 24, 48, 96 or 384 apertures 62. In an embodiment, the apertures 62 are circular through holes. Alternatively, the apertures 62 may have other non-circular cross-sections. In an embodiment, a transparent window or windows 62a (one of which is shown for exemplary purposes in FIG. 6), for example a polycarbonate strip or strips, or lenses, could be located at least partly in, above and/or below the apertures 62. This has the advantage of retaining the heated air in proximity to the lens covers, improving both the thermal uniformity and the power efficiency.

In an embodiment, the board 80 is a printed circuit board (PCB). The substrate of the board 80 may comprise fibre-glass, such as FR-4 glass epoxy. The substrate has relatively poor thermal conductivity, substantially inhibiting or frustrating heat conduction through that board 80 (that is, substantially inhibiting or frustrating thermal transfer/heat conduction through the board that is not through the vias 82, 84 (discussed below)), and allowing a relatively low thermal mass layer 86 (discussed below) to rapidly achieve target temperature on start-up.

In an embodiment, the substrate of the board 80 has a glass-transition temperature ($T_g$) that is greater than or equal to about 120° C., greater than or equal to about 130° C., greater than or equal to about 140° C., or greater than or equal to about 150° C. In an embodiment, without limitation by way of example only, the dimensions (length×width) of the board 80 may be about 80-100 mm×40-60 mm. In an embodiment, the board 80 has a thickness of about 0.2 mm to about 2.3 mm, about 0.4 mm to about 2.0 mm, about 0.5 mm to about 1.6 mm, about 0.6 mm to about 1.6 mm, about 0.8 mm to about 1.5 mm, about 1.0 mm to about 1.5 mm, or about 1.2 mm. In the instance of the board 80 having 16 apertures 62, each aperture 62 of the apertures 62 may have, without limitation and for example only, a width (diameter) of about 4 mm to about 8 mm, suitably about 5.5 mm. The aperture(s) 62 may be other sizes(s) and, in instances where the board 80 has more than one aperture, the apertures 62 may be different sizes relative to one another.

Figure 7:
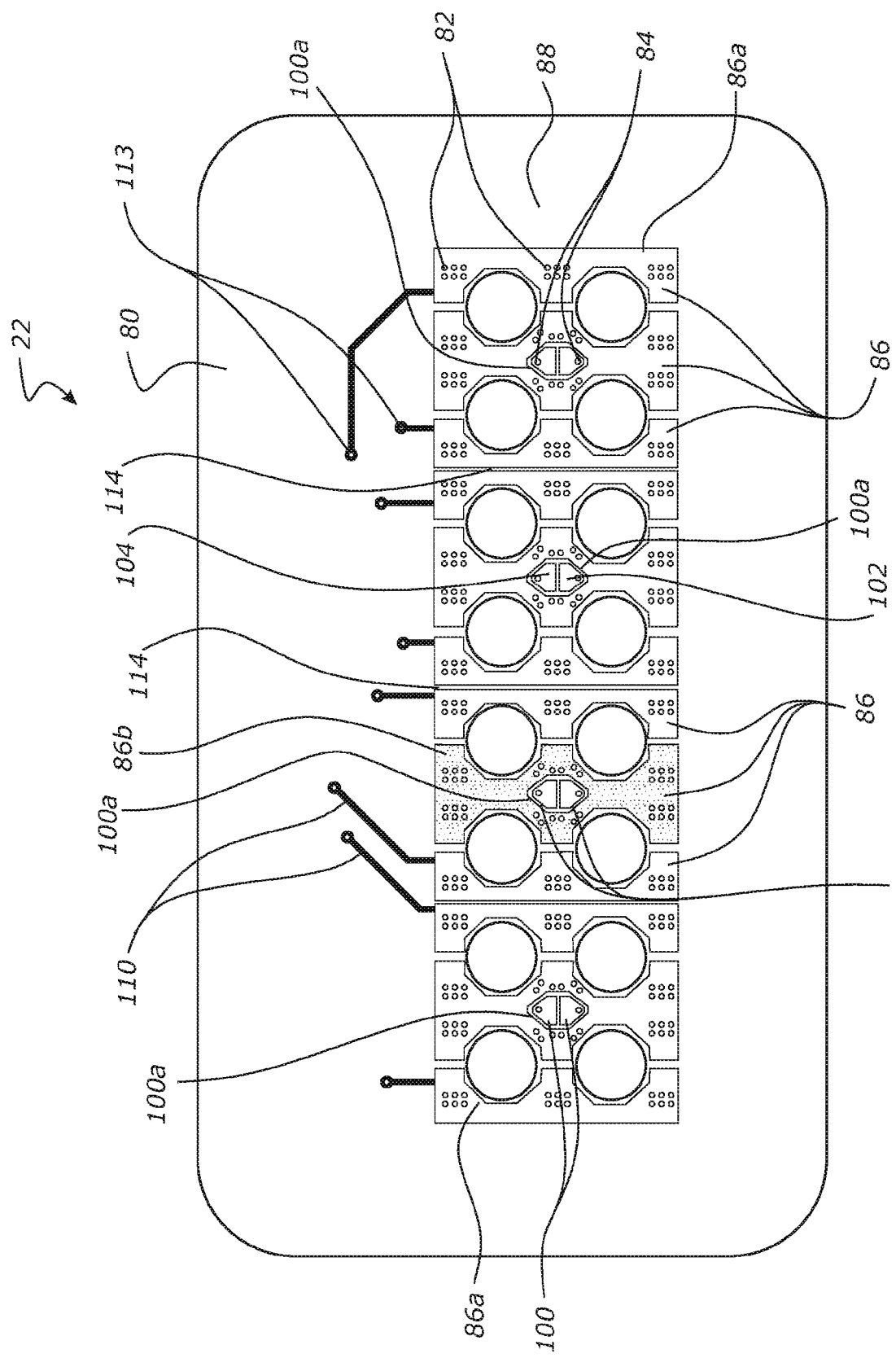
FIG. 7 is a plan line view of a first, or front, face of the reaction vessel cover heater of FIG. 6 that is arranged to face towards a cover of the reaction vessel.

With reference to FIG. 7, the reaction vessel cover heater 22 comprises a thermally conductive, heat-spreading layer 86. The heat-spreading layer 86 is arranged on a first, front face (or side) 88 of the board 80 that is arranged to face the covers 34. The heat-spreading layer 86 is configured to radiate, and/or distribute, heat towards the covers 34. In an embodiment, the heat-spreading layer 86 is configured to spread, and/or distribute, heat over a substantial area in a plane of, and/or on or near or closely adjacent, the front face 88. In an embodiment, the heat-spreading layer 86 is configured to spread, and/or distribute, heat over the entire area of the heat-spreading layer.

In an embodiment, the reaction vessel cover heater 22 is arranged or positioned, in use, so that the front face 88 of the board 80/heat-spreading layer 86 is about 1 mm to about 3 mm, about 1.5 mm to about 2.5 mm, or about 2 mm from the cover(s) 34 of the vessels 14. The apertures 62 are aligned with respective receptacles 38. The reaction vessel cover heater 22 is configured to radiatively heat a pocket or pockets of air (or another fluid) between the front face 88 of the board 80/heat-spreading layer 86 and the cover(s) 34 of the vessels 14. Alternatively, the front face of the board 80/heat-spreading layer 86 may be in, or substantially in or close to in, direct contact with the cover(s) 34 or another intermediary heat-transferring member 23 between the heat-spreading layer 86 and the cover(s) 34. In an alternative embodiment, the reaction vessel cover heater 22 may be arranged or positioned, in use, so that the front face 88 of the board 80/heat-spreading layer 86 is located about 0 mm to about 1 mm from the cover(s) 34 of the vessels 14.

Figure 8:
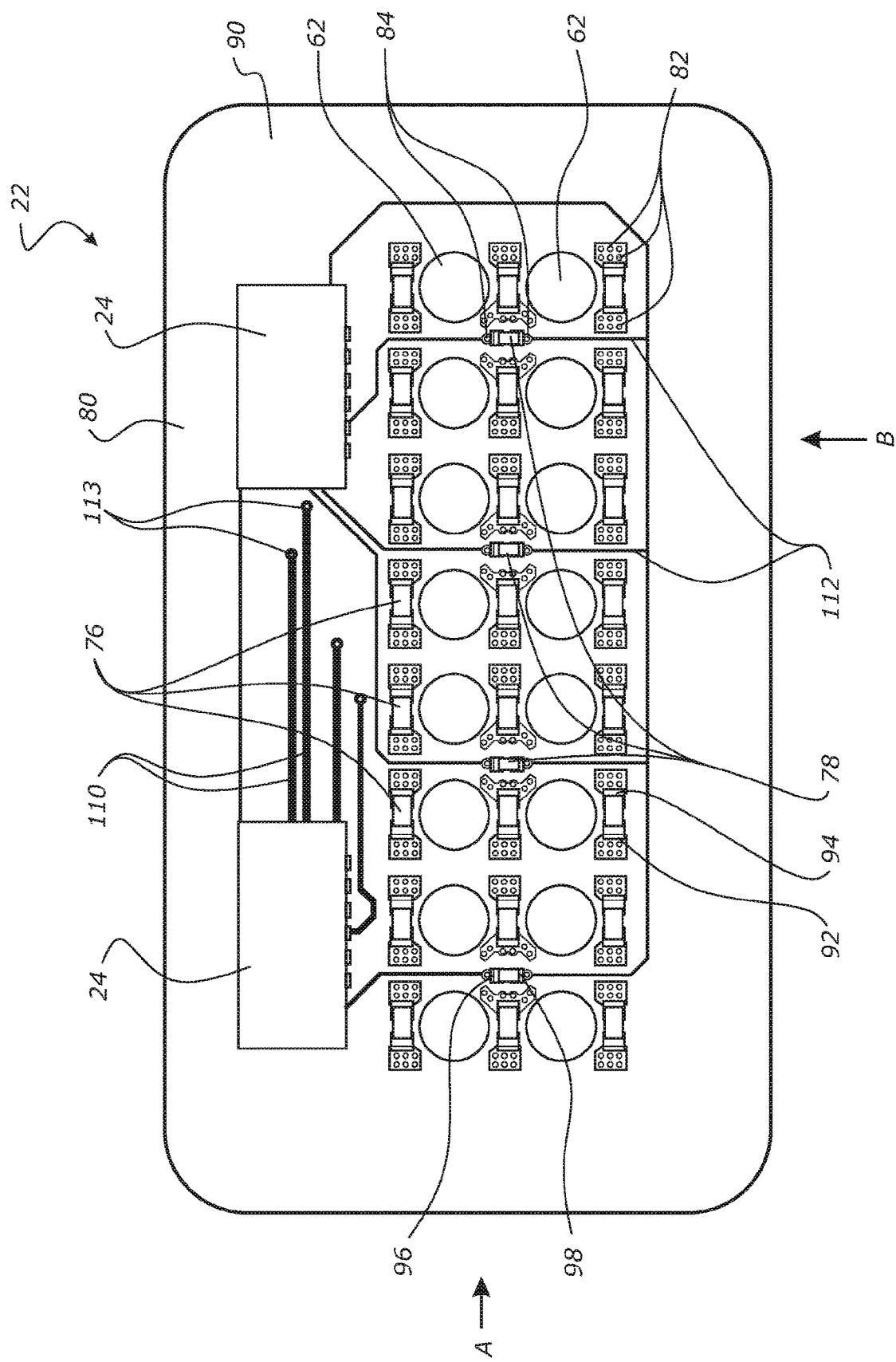
FIG. 8 is a plan line view of a second, or back, face of the reaction vessel cover heater of FIG. 6 that is arranged to face away from a cover of the reaction vessel.
Figure 9:
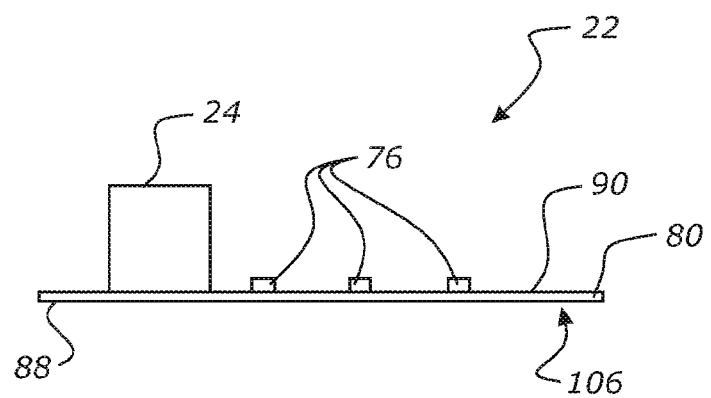
FIG. 9 is an end view of the reaction vessel cover heater in the direction A in FIG. 8.
Figure 10:
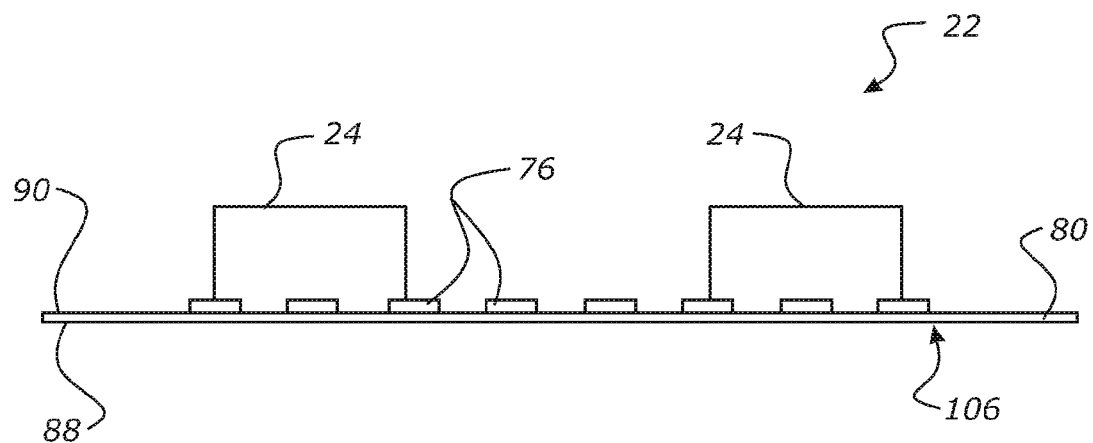
FIG. 10 is a side view of the reaction vessel cover heater in the direction B in FIG. 8.

With reference to FIG. 8, the reaction vessel cover heater 22 comprises at least one heating element 76 configured to output heat to the heat-spreading layer 86. The heating elements 76 are arranged on a second, back face (or side) 90 of the board 80 that is arranged to face away from the covers 34. The back face 90 is on an opposite side of the board 80 to the front face 88. The example reaction vessel cover heater 22 shown in FIGS. 6-11 has a plurality of heating elements 76, specifically 24 generally spaced apart heating elements 76. However, the reaction vessel cover heater 22 may have more or less heating elements 76 depending on several design factors, for example, the size of the board 80; the number, size(s) and relative spacing(s) of the apertures 62; the locations of the heating elements 76, and the heat output of the heating elements 76.

The heat-spreading layer 86 is in thermal and/or electrical communication with, or thermally and/or electrically connected or coupled to, the at least one heating element 76 by at least one heating via 82, or thermally and/or electrically conductive pathway or connection, through the board 80. The example reaction vessel cover heater 22 comprises a plurality of spaced apart vias, specifically 288 vias. In particular, the reaction vessel cover heater 22 has 12 vias 82 that extend between each heating element 76 and the heat-spreading layer 86, six vias 82 that generally extend through the board 80 from a position at or near a first end 92 of the heating element 76 to the heat-spreading layer 86, and four vias generally that generally extend through the board 80 from at or near a second end 94 (generally opposite the first end 92) of the heating element 76 to the heat-spreading layer 86. However, the reaction vessel cover heater 22 may have more or less of the vias 82 depending on several design factors, for example, the size of the board 80; size(s) and relative spacing(s) of the apertures 62; the locations of the heating elements 76; and the heat output of the heating elements 76.

In an embodiment, the heating elements 76 are surface-mount devices (SMDs). In an embodiment, the heating elements 76 comprise or are resistors. In an embodiment, the heating elements 76 are each generally located adjacent, at or near, a perimeter (or circumference) of at least one of the apertures 62.

With reference to FIG. 8, the reaction vessel cover heater 22 further comprises at least one temperature-sensing element (or temperature sensor) 78 positioned and configured to sense the prevailing temperature at or near one or more locations (e.g. 100a in FIG. 7) on the front face 88 of the board 80, the heat-spreading layer 86, the air pocket(s) between the layer 86 and the cover(s) 34, and/or the cover(s)

34. The temperature-sensing element(s) 78 are arranged on the back face 90 of the board 80. The reaction vessel cover heater 22 has a plurality of temperature sensors 78, specifically four generally spaced apart temperature sensors 78. However, the reaction vessel cover heater 22 may have more or less temperature sensors 78.

The temperature sensors 78 are in thermal and/or electrical communication with, or thermally and/or electrically connected or coupled to, the one or more locations on the front face 88 by at least one sensor via 84, or thermally and/or electrically conductive pathway or connection, for the transfer of heat through the board 80. The example reaction vessel cover heater 22 comprises a plurality of spaced apart sensor vias 84, specifically eight vias. In particular, two vias 84 that extend between each temperature sensor 78 and the front face 88, one via that generally extends through the board 80 from at or near a first end 96 of the temperature sensor 78 to the heat-spreading layer 86 and one via that generally extends through the board 80 from at or near a second end 98 (generally opposite the first end 96) of the heating element 76 to the heat-spreading layer 86. However, the reaction vessel cover heater 22 may have more or less of the vias 84 depending on the design requirements of the board 80, including: the number, size(s) and relative spacing(s) of the apertures 62; the locations of the heating elements 76 and the temperature sensors 78; and the heat output of the heating elements 76.

In an embodiment, the temperature sensors 78 comprise or are SMDs. In an embodiment, the temperature sensors 78 comprise or are thermally sensitive resistors, the resistance of the or each resistor being dependent on, and changing in response to changes in, temperature. In an embodiment, the temperature sensors 78 comprise or are platinum resistance temperature detector(s) or thermistor(s). The temperature sensors 78 may comprise or be negative temperature coefficient (NTC) thermistors(s). In another embodiment, the temperature sensors 78 may comprise or be a temperature measuring integrated circuit.

In an embodiment, the temperature sensors 78 are each generally located adjacent, at or near, a perimeter (or circumference) of at least one of the apertures 62. In an embodiment, the temperature sensors 78 are each generally located adjacent, intermediate two or more apertures 62, for example intermediate or between four apertures 62 (as shown in FIG. 8). In an embodiment, the temperature sensors 78 are each generally located intermediate, and spaced apart from, two or more heating elements 76, for example intermediate or between two heating elements 76 (as shown in FIG. 8).

In an embodiment, the reaction vessel cover heater 22 comprises at least one thermally and/or electrically conductive temperature-sensing member 100 in the form of at least one sensor member, or pad or deposit or formation or layer, arranged on the front face 88 of the board 80. In an embodiment, the reaction vessel cover heater 22 comprises at least one of the members 100 for each temperature sensor 78. In an embodiment, the reaction vessel cover heater 22 comprises eight sensor members 100 each comprising two sensor members 102, 104 (spaced apart to inhibit or frustrate heat transfer between the members 102, 104) for each temperature sensor 78.

Each sensor member 100 is in thermal and/electrical communication with, or thermally and/or electrically connected or coupled to, one of the temperature sensors members 78 by at least one of the sensor vias 84 for the transfer of heat between the member 100 and the respective sensor 78. The one or more locations 100a on the front face 88 correspond to one or more locations on or of the sensor member(s) 100.

The elements 76 and sensors 78 are connected to the controller 24 and the vias by electrically and/or thermally conductive tracks or pathways 110, 112 (discussed below), by, for example copper tracks or pathways, arranged on the front or back faces 88, 90 of the board 80. The heating elements 76 are electrically isolated, or insulated, from the temperature sensors 78. Many other alternative configurations/arrangements of the heating elements 76, temperature sensors 78, the vias 82, 84 and the tracks 110, 112 on the front and back faces 90 are possible.

Each sensor member 100 is substantially thermally insulated from the heat-spreading layer 86 to at least inhibit, or frustrate, thermal transfer through conduction between the member and the heat-spreading layer 86; for example, such as through a (air) gap or gaps 101 between the sensor member 100 and the layer 86, and/or a space or spaces around the perimeter of the sensor member 100. Each sensor member 100 may be generally located within a same plane as, and generally within but still substantially thermally isolated or insulated from, the heat-spreading layer 86. Alternatively, or additionally, an insulating material (such as PCB board substrate, particularly if the heat-sensing layer 86 and/or sensor members 100 are recessed into the front face 88 of the board 80, or another material) may be provided between the layer 86 and the sensor members 100.

In an embodiment, each sensor member 100 is substantially thermally and/or electrically insulated from the other sensor members 100.

A surface 106 of the heat-spreading layer 86, the or each sensor member 100, or each of the heat-spreading layer 86 and the or each sensor member 100, that is arranged to face the cover 34 may be substantially planar (or flat). In an embodiment, the surface 106 of the heat-spreading layer 86 and the surfaces of the sensor members 100 that are arranged to face the cover 34 are substantially planar (or flat). The cover-facing surfaces 106 of the heat-spreading layer 86 and the sensor members 100 are generally located within the same plane.

The heat-spreading layer 86, the or each sensor member 100, or each of the heat-spreading layer 86 and the sensor member 100 may comprise or be a thermally and/or electrically conductive material applied to, formed or deposited on the board 80. In an embodiment, the heat-spreading layer 86 and the sensor members 100 comprise or are a thermally and/or electrically conductive material applied to, or arranged or deposited on, the board 80. In one embodiment, the heat-spreading layer 86 (or one or more sections 108a-d of the heat-spreading layer 86, discussed below) and/or the sensor members 100 may be at least partly recessed into the front face 88.

The heat-spreading layer 86 and/or the sensor members 100 may be comprised of copper. The heat-spreading layer 86 and the sensor members 100 comprise or are a foil, such as a copper foil, or film applied to, or formed or deposited on, the board 80. Advantageously, the reaction vessel cover heater 22/board 80 may manufactured using conventional PCB board manufacturing process(es). A (copper) foil may be laminated, or deposited or formed, on the front surface 88. Copper is then selectively removed from the face 88, such as by chemical etching, to form the layer 86 that defines the heating region(s) and the members 100 that define the temperature-sensing regions. A mask, or resist, protects the copper (layer 86 and members 100) remaining on the front face during the etching.

The heat-spreading layer 86 and/or the sensor members 100, optionally both the layer 86 and the members 100, without limitation and for example only, may each have thickness of greater than or about 17.5 μm (for example, copper foil having a thickness of about 0.5 oz/ft$^2$), greater than or about 35 μm (about 1 oz/ft$^2$), greater than or about 70 μm (about 1.5 oz/ft$^2$), or about 70 μm (about 2 oz/ft$^2$).

In an embodiment, a coating, or layer or film, such as a black solder mask (shown by feature 86b in FIG. 7 for example) is applied on the cover-facing surfaces of the heat-spreading layer 86 and the sensor members 100. The darker colour improves the radiation characteristics of the cover-facing surfaces 86a (black body radiator) compared to a light colour, such as exposed copper foil.

Alternatively, the heat-spreading layer 86 and/or the sensor member(s) 100 may comprise or be other materials, other than copper (including different materials to one another).

The or each heating via 82 may be the same as or similar to, the or each sensor via 84. In an embodiment, the heating vias 82 are substantially the same as the sensor vias 84. The vias 82, 84 each comprise and/or are filled with a thermally conductive material. The thermally conductive material may comprise or be copper. Alternatively, the physical characteristics of one or more of the heating vias 82 and one or more of the sensor vias 84 may be different to each other. And/or the heating vias and/or the sensor vias may comprise other materials. Without limitation and by way of example, the vias 82, 84 may each have a diameter (or width) of about 0.2 mm to about 0.7 mm, about 0.35 mm to about 0.55 mm, say about 0.45 mm. Larger size vias have more (copper) surface area from top to bottom, and hence conduct better thermally. However, larger size vias take up more room on the board limiting the number of vias in a given area.

Figure 6:
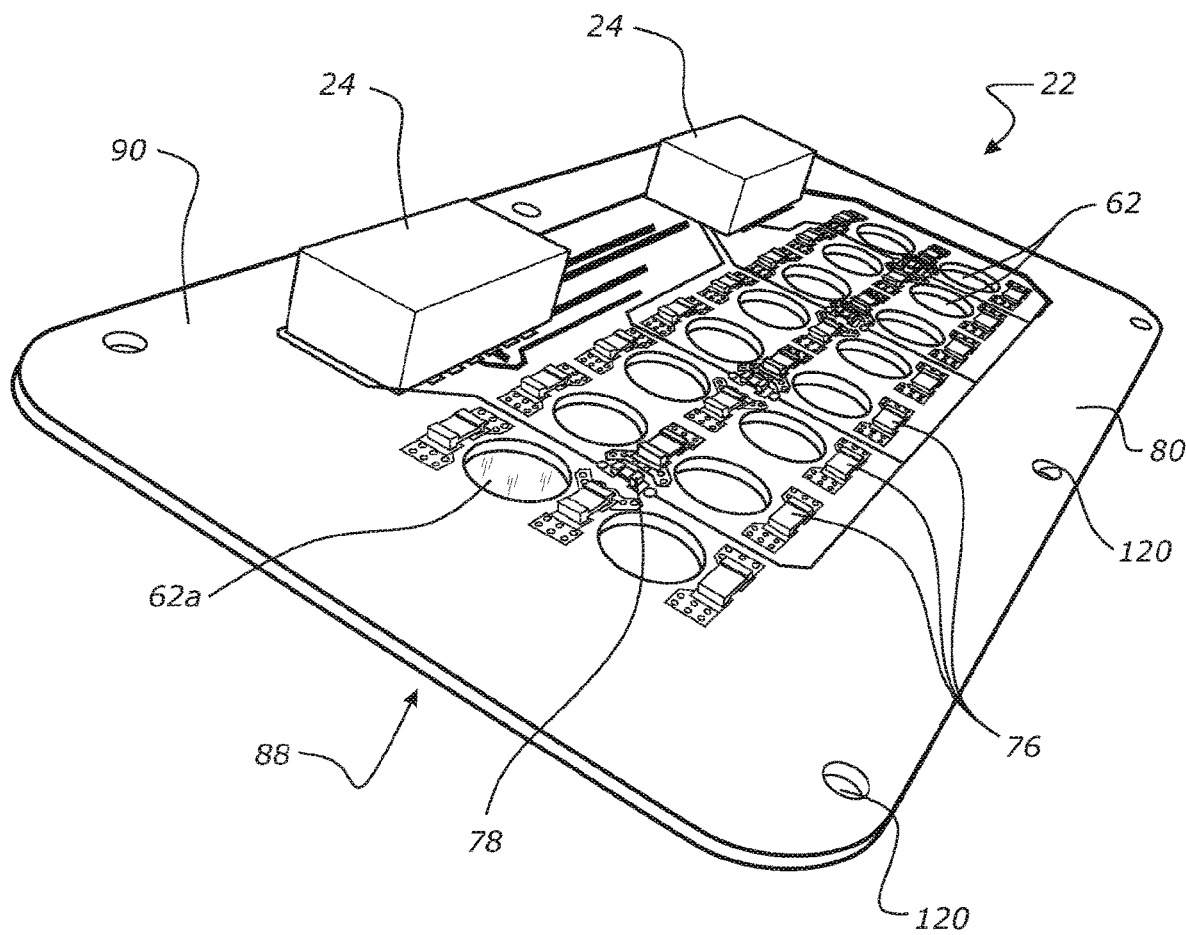
FIG. 6 is a schematic perspective line view of a reaction vessel cover heater of the device of FIG. 1.

With reference to FIGS. 6-8, the controller 24 (part of which may be arranged on the board 80, as shown schematically in FIGS. 6 and 8) controls the operation of the heating elements 76 and receives temperature-indicative information from the temperature sensors 78 via one or more thermally and/or electrically conductive tracks or pathways 110, 112. The tracks 110 that are arranged on the front face 88 and the back face 90 electrically couple the controller 24 to the layer 86, which is electrically coupled (through the vias 82) to heating elements 76 on back face 90. The tracks 110 extend through the board 80 to electrically couple the controller 24 (partly arranged on the back face 90) and the layer 86 (on the front face 88) by coupling vias 113, pathways or connections, that pass through the board 80. The coupling vias 113 may the substantially the same or similar to the vias 82, 84. The tracks 112 arranged on the back face 90 of the board 80 electrically couple the controller 24 to the sensors 78. In an embodiment, the one or more tracks 110, 112 are one or more copper tracks arranged, or applied to formed, on faces 88, 90 of the board 80. The track(s) 110 associated with the heating elements 76 and the tracks 112 associated with the sensors 78 are thermally and/or electrically insulated, or isolated or separate, from one another. Many other arrangements of the connecting/coupling tracks or pathways 110, 112 are possible.

Figure 11:
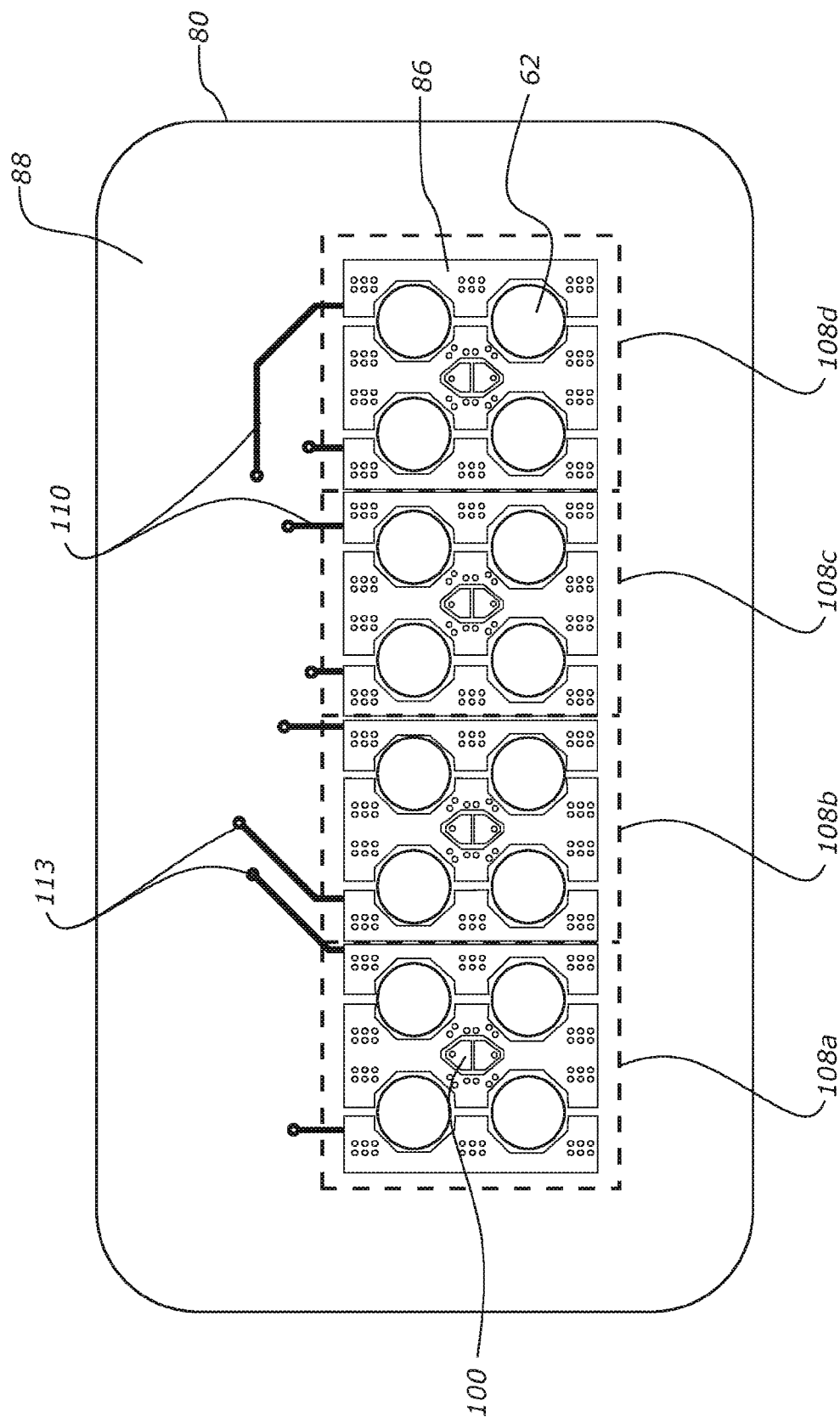
FIG. 11 is a plan line view (same as in FIG. 7) of the first, or front, face of the reaction vessel cover heater of FIG. 6 that is arranged to face towards a cover of the reaction vessel, schematically showing the independently controlled sections of the heat-spreading layer.

In an embodiment, with reference to FIG. 11 the heat-spreading layer 86 comprises a plurality of heat-spreading sections 108a-d, or regions or portions or zones (shown schematically in dashed lines). Each heat-spreading section 108a-d of the layer 86 is configured to radiate, and/or distribute, heat towards the covers 34. In an embodiment, each heat-spreading section 108a-d of the layer 86 is configured to spread, and/or distribute, heat over a plane of, and/or on or near or closely adjacent, the front face 88 of the board 80. Each heat-spreading section 108a-d is arranged on, or applied to or formed on, a corresponding section, or region or portion or zone, of the front face 88.

The reaction vessel cover heater 22 has four sections 108a-d arranged in a row on the front face 88, two end sections 108a and 108d and two intermediate sections 108b and 108c. However, the number and arrangement of the sections can be readily scaled/changed. The reaction vessel cover heater 22 may have less or more sections depending on, for example, the size of the board 80 and/or the number of receptacles 38. Further, the heat-spreading sections 108a-d do not need to be arranged linearly. For example, if the receptacles 38 are arranged substantially in a square or in more than two rows, the sections 108a-d may be arranged in a two-dimensional array.

For each heat-spreading section 108a-d, the reaction vessel cover heater 22 comprises at least one respective heating element 76 configured to output heat to the heat-spreading section 108a-d. In an embodiment, the reaction vessel cover heater comprises six heating elements 76 for each heat-spreading section 108a-d. For each heat-spreading section 108a-d, the reaction vessel cover heater 22 comprises at least one respective temperature sensor 78 arranged on the back face 90 and corresponding respective sensor member(s) 100 arranged on the front face to sense, or detect, the prevailing temperature.

Each heat-spreading section 108a-d is substantially thermally and electrically insulated from the other heat-spreading sections to at least inhibit, or frustrate, thermal transfer via conduction between each heat-spreading section 108a-d and the other heat-spreading section(s) 108a-d. For example, by way of an isolating or insulating gap or gaps 114, or space or spaces, between each heat-spreading section 108a-d and the other heat-spreading section(s) 108a-d. The gap or gaps 114 may be an air gap or gaps (as shown in FIGS. 6-8A). Alternatively, another insulating material may be provided in the gap or gaps.

The heating element(s) 76 of one section 108a-d are independently controlled or controllable relative to the heating element(s) 76 of one or more of the other section(s) 108a-d to independently control the heat output from the one heat-spreading section 108a-d relative to the one or more other heat-spreading sections 108a-d. In the embodiment reaction vessel cover heater 22, heating element(s) 76 of each section 108a-d are independently controlled or controllable relative to the heating element(s) 76 of one or more of the other section(s) 108a-d to independently control the temperature and/or heat output from the one heat-spreading section 108a-d relative to the one or more other heat-spreading sections 108a-d. Alternatively, the heating element(s) 76 of the ends sections 108a, 108d may be independently controlled or controllable relative to the heating element(s) 76 of the intermediate sections 108b, 108c.

The controller 24 of the device 10 (or apparatus) for detecting molecule(s) is coupled to and configured to control the operation of the heating elements 76. The controller 24 is configured to control the temperature and/or heat output of the heating elements 76 based on the sensed temperature(s) (using the temperature sensors 78). The controller may be configured to control the temperature/heat output of the heating elements 76 by comparing the sensed temperature(s) and a predetermined temperature (or temperatures or temperature range) for the cover(s) 34. The predetermined temperature for a particular protocol may be, for example, in the range of about 95° C. to about 120° C., about 95° C. to about 110° C., or about 100° C. to about 110° C.

In the embodiment device 10, the controller 24 is configured to independently control the heating element(s) 76 of one or more of the sections 108*a-d* of the heat spreading layer 86 relative to the heating element(s) 76 of one or more of the other section(s) 108*a-d* based at least partly on comparing the sensed temperature(s) and the predetermined temperature(s) for the covers 34.

Alternatively, in another embodiment, the controller 24 may be configured to control the operation of the heating elements 76 of two of more of the sections 108*a-d* at the same power and/or heat output (that is, not independently relative to one another).

The independent control of the heat-spreading sections 108*a-d* of the layer 86 enables one or more the sections to be maintained at a temperature (or temperature range), and so radiate more or less heat towards the cover(s) 34, compared to one or more of the other section(s) of the layer 86. Accordingly, independently controlling the heat-spreading sections 108*a-d* can be used to avoid or mitigate 'edge effects' when heating the cover(s) 34, without substantial cross-'pollination' or heat transfer between the adjacent sections that are advantageously thermally isolated or insulated from one another.

Without limitation and for example only, the two end (or outer) sections 108*a*, 108*d* of the layer 86 where more heat is typically lost to the outside environment/housing can be maintained at a first temperature (or temperature range) of around 110° C., and the two intermediate (or interior) sections 108*b*, 108*c* of the layer 86 can be maintained at a second (lower than the first) temperature (or temperature range) of around 100-105° C. For example, the first temperature may be about 5-10° C., about 6-7° C., or about 8° C. higher than the second temperature.

At least one temperature sensor 78 is associated with each section 108*a-d* to accurately measure the temperature of the section. The planar arrangement of the highly thermally conductive heat-spreading layer 86, and sections 108*a-d* of the layer 86, that extend across the front face 88 minimises temperature differentials across the front face 88 of the board 80.

Further, in an embodiment different PCR protocols requiring different cover temperatures, which would normally need to be run separately, can be run simultaneously. One or more sections 108*a-d* of the heat-spreading layer 86 can be maintained at or around a first temperature or temperature range corresponding to a first protocol, and one or more other sections 108*a-d* of the heat-spreading layer 86 can be maintained at or around a second (different to the first) temperature or temperature range corresponding to a second protocol.

Further, the independent control of the heat-spreading sections 108*a-d* of the layer 86 enables one or more other sections 108*a-d* of the heat-spreading layer 86 to be selectively turned off/shut down. For example, in a reaction vessel holder having (for example 96) receptacles 38 (or wells), in which only some (for example 16) of the receptacles 38 have vessels 14/samples, it is possible to shut down the heating of sections 108*a-d* overlying receptacles 38 where no samples are present in order to save power and extend battery run-time and/or life.

Figure 12:
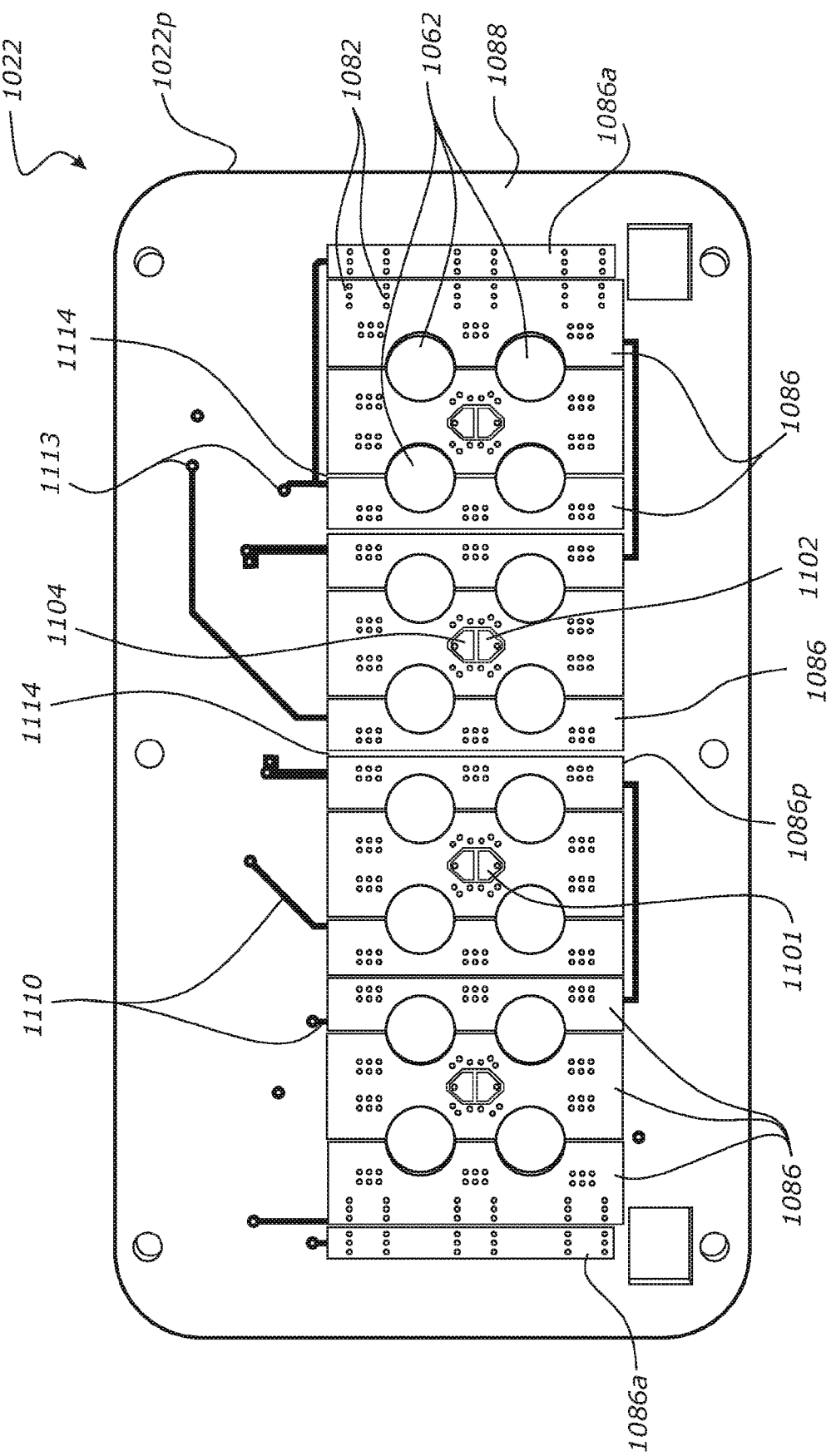
FIG. 12 is a plan line view of a first, or front, face of another embodiment of the reaction vessel cover heater that is arranged to face towards a cover of the reaction vessel.
Figure 13:
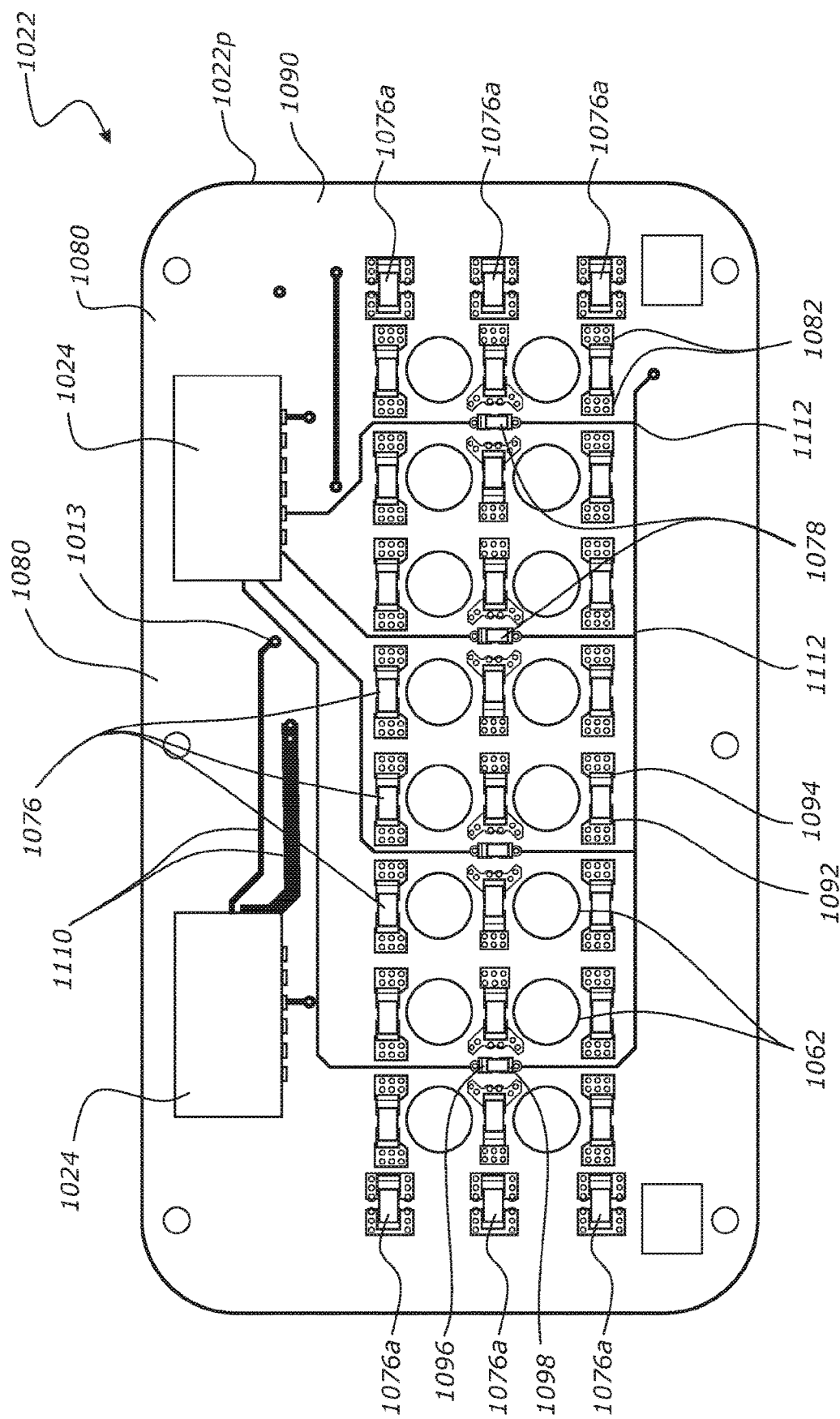
FIG. 13 is a plan line view of a second, or back, face of the reaction vessel cover heater of FIG. 12 that is arranged to face away from a cover of the reaction vessel.

With reference to FIGS. 12 and 13 an alternative embodiment of the reaction vessel cover heater will now be described. The reaction vessel cover heater 1022 has the same features and functionality as the cover heater shown and described in relation to FIGS. 6 to 11, unless described below. Like numbers are used to indicated like parts with the addition of 1000.

FIGS. 12 and 13 show the heat-spreading layer 1086 in the shape of a rectangle having a long dimension (height) and a short dimension (width). In this embodiment, the thermally conductive, heat-spreading layer 1086 has a longer height than the height of the heat-spreading layer 86 of the earlier embodiment. In this embodiment, the heat-spreading layer 1086 has a longer width than the height of the heat-spreading layer 86 of the earlier embodiment. The longer height and width together form a heat-spreading layer 1086 that has a larger area than the heat-spreading layer 86 of the earlier embodiment. The larger area of the heat-spreading layer 1086 may comprise additional heat-spreading sections compared to the first embodiment, or may comprise one of the heat-spreading sections having a larger area compared to the first embodiment.

The position of the apertures 1062 relative to the perimeter 1022*p* of the board has not changed compared to the earlier embodiment, which results in a distance or overhang between the apertures and the perimeter 1086*p* of the heat-spreading layer 1086 being larger than the corresponding distance of the earlier embodiment. This increased distance or overhang further mitigates the edge effects in which the air temperature at the edge or periphery 1086*p* of the heat-spreading layer 1086 falls below the target temperature. It will be understood that the temperature falling below the target temperature could result in unwanted condensation of the tube lids.

In addition to increasing the area of the heat-spreading layer 1086, the alternative embodiment of the reaction vessel cover heater 1022 further comprises one or more additional heating elements 1076*a*. In the embodiment shown, the additional heating elements 1076*a* are resistors. The additional heating elements 1076*a* are arranged in rows, each row is an extension of the row of the heating elements. The reaction vessel cover heater 1022 may have more or less additional heating elements 1076*a* depending on several design factors, for example, the size of the board 1080; the number, size(s) and relative spacing(s) of the apertures 1062; the locations of the heating elements 1076 and additional heating elements 1076*a*; and the heat output of the heating elements 1076 and additional heating elements 1076*a*.

Casing

Figure 14:
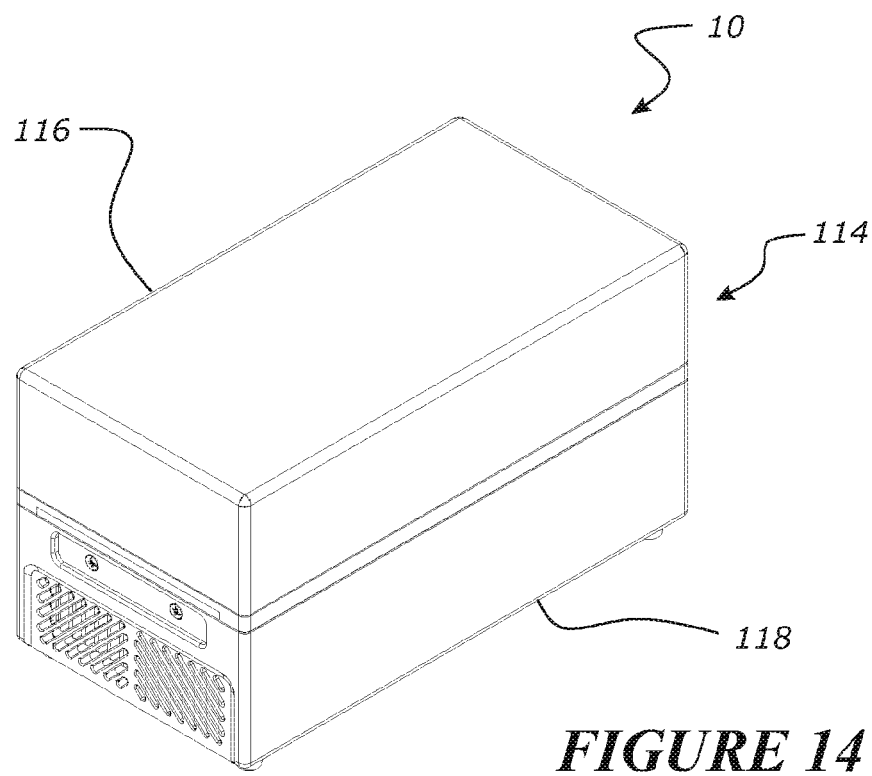
FIG. 14 is a schematic perspective view of a portable device for detecting molecule(s) according to an embodiment of the present invention, the device being in a closed configuration.
Figure 15:
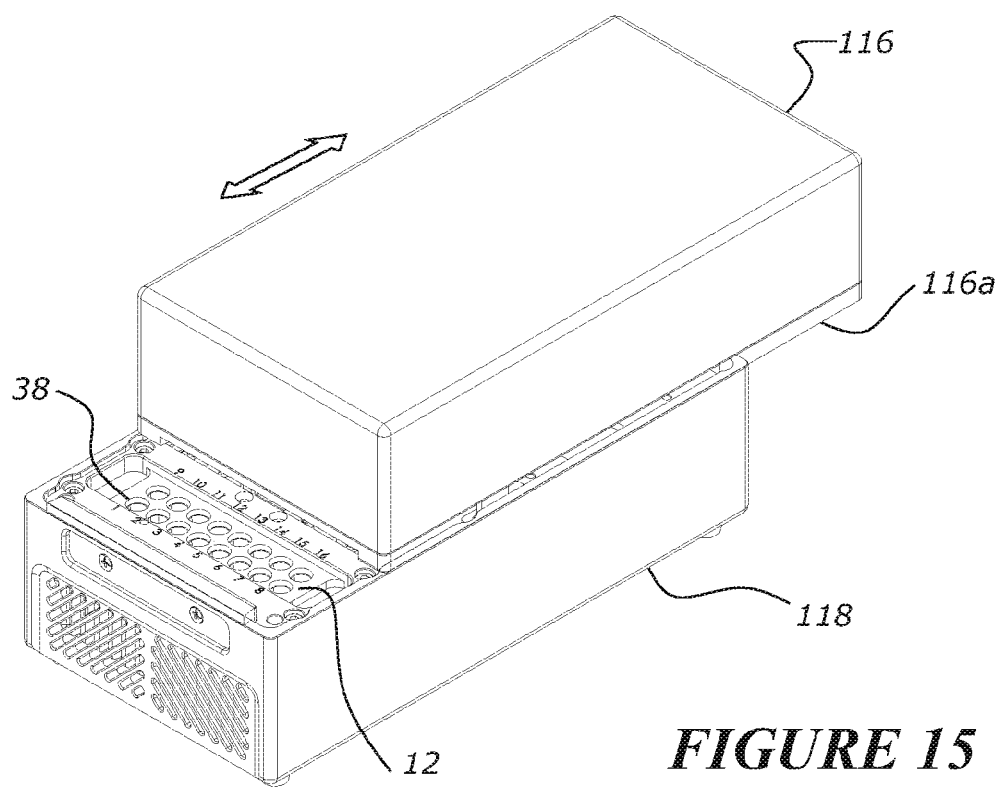
FIG. 15 is a schematic perspective view of the device of FIG. 14, the device being in an open configuration.

With reference to FIGS. 14 and 15, a housing 114 of the portable device 10 comprises an upper casing or lid 116 and a lower casing or base 118, the upper casing 116 being slidingly engageable with the lower casing 118. The upper casing 116 slides or moves relative to the lower casing 118 to move the device 10 between a closed configuration (FIG. 14) and an open configuration (FIG. 15). Alternatively, for example the upper casing 116 may be hingedly connected to the lower casing 118 so that the upper casing 116 is pivotable relative to the lower casing 118. Alternatively, the upper casing 116 may clip onto or be similarly fastened to the lower casing 118 (or vice versa).

The upper casing 116 generally houses and retains the optical assembly 18 (including the excitation arrangement 26, the guide arrangement 28 and the detection arrangement 30) and the reaction vessel cover heater 22. The reaction vessel cover heater 22 is removably secured to the housing/upper casing, generally below the optical assembly 18, using one or more fasteners that optionally engage the periphery of the board 80 (not having the heat-spreading layer 86). For example, the fasteners may be stainless steel screws that pass through through holes 120 in the board 80 and thermally insulating washers that act as spacers to separate and thermally insulate the board 80 from the underside of the upper casing 116. The upper casing 116 may also house and retain, for example, components of the controller 24, including a microcontroller and associated printed circuit board 80. The lower casing 118 generally houses and retains the reaction vessel holder 12 (and reaction vessel(s) 14) and the heater/cooler 20, optionally at or near one end of the lower casing 118 to facilitate access to the reaction vessel(s) 14 in the open configuration. The lower casing 118 may further house and retain for example, a digital power switch circuit, USB interface circuit, battery management module and power supply/battery, TEC control module, power switch, system light, and power socket.

In the closed configuration (FIG. 14), the upper casing 116 covers or overlies the reaction vessels 14 in the lower casing 118 to enable molecule detection of the sample within the reaction vessels 14. The reaction vessel cover heater 22 (retained in the upper casing 116) overlies and is substantially parallel to the cover(s) 34 of the vessels 14. The reaction vessel cover heater 22 is retained relative to the reaction vessel(s) 14 so that the front face 88 of the board 80/surfaces 106 of the heat-spreading layer 86 and members 100, are about 1 mm to about 3 mm, about 1.5 mm to about 2.5 mm, or about 2 mm from the cover(s) 34 of the vessels 14.

Alternatively, the front face 88/surfaces 106 may be positioned about 0 mm to about 1 mm from the cover(s) 34. In the open configuration (FIG. 15), the reaction vessel holder 12 is advantageously exposed so that the reaction vessel(s) 14 can be placed into or removed from the reaction vessel holder 12/lower casing 118.

The upper casing 116 and lower casing 118 may be formed of a metallic material, for example, aluminium. Alternatively, the casings 116, 118 may be formed from other materials. The upper and lower casings 116, 118 may be of a substantially similar size. In one embodiment, without limitation by way of example only, the dimensions (length×width×height) of the upper casing 116 and the lower casing 118 may each be about 110 mm×70 mm×50-60 mm.

In the described embodiments, the front face 88 and the cover-facing surfaces 106 of the heat-spreading layer 86/sections 108a-d and the sensor members 100 that are all generally arranged in a common plane present a relatively smooth and/or flat outward, or cover-facing, surface(s) 106. The heating element(s) 76 and the temperature sensors 78 are arranged on, and generally protrude from, the back face 90. The element(s) 76 and the sensor(s) 78 are connected by vias to the heat-spreading layer 86/sections 108a-d and the sensor members 100, respectively, that generally extend in a plane or planes across the front face 88. Advantageously, the surface(s) 106 that is or are generally located at a bottom 116a of the upper housing 116 do not have any components that substantially protrude from the front face 88 (for example, heating elements 76, or temperature sensors 78) and that could catch or snag on, for example, the lower casing 118 and/or reaction vessel holder 12/vessels 14 when slidingly opening and closing the device 10 by moving the upper casing relative to the lower casing.

Embodiments of the invention have been described by way of example only and modifications may be made thereto without departing from the scope of the invention.

The invention claimed is:

1. A heater for heating a substantially transparent or translucent cover of a reaction vessel, the heater comprising:
    a board having a front face and an opposing back face, and having an aperture through which an excitation beam can pass into a reaction vessel via a cover of the reaction vessel, and/or through which reaction light can pass from the reaction vessel via the cover; and
    a thermally conductive, heat-spreading layer configured to radiate heat towards a cover of a reaction vessel, the heat-spreading layer being arranged on the front face of the board that is arranged to face the cover; and
    at least one heating element configured to output heat to the heat-spreading layer, the heating element being arranged on the back face of the board that is arranged to face away from the cover of a reaction vessel;
    the heat-spreading layer being in thermal communication with the heating element by at least one heating via through the board.

2. The heater according to claim 1, wherein the heater comprises:
    at least one temperature-sensing element configured to sense the temperature at or near one or more locations on the front face of the board, the temperature-sensing element being arranged on the back face of the board;
    the temperature-sensing element being in thermal communication with the one or more locations on the front face of the board by at least one sensing via through the board.

3. The heater according to claim 2, wherein the heater comprises:
    a thermally conductive temperature-sensing member arranged on the front face of the board, the temperature-sensing member being in thermal communication with the temperature-sensing element by the sensing via;
    wherein the one or more locations on the front face correspond to one or more locations on the temperature-sensing member.

4. The heater according to claim 3, wherein the temperature-sensing member is substantially thermally insulated from the heat-spreading layer to at least inhibit thermal transfer via conduction between the member and the layer.

5. The heater according to claim 3, wherein a surface of the heat-spreading layer that is oriented to face the cover, a surface of the temperature-sensing member that is oriented to face the cover, or each of the surface of the heat-spreading layer that is oriented to face the cover and the surface of the temperature-sensing member that is oriented to face the cover, is substantially planar.

6. The heater according to claim 3, wherein the heat-spreading layer, the temperature-sensing member, or each of the heat-spreading layer and the temperature-sensing member, comprises a thermally conductive material arranged on, or applied to or formed, on the board.

7. The heater according to claim 3, wherein the heat-spreading layer, the temperature-sensing member, or each of the heat-spreading layer and the temperature-sensing member, has a thickness of greater than or about 17.5 µm, greater than or about 35 µm, greater than or about 70 µm, or about 70 µm.

8. The heater according to claim 2, wherein the temperature-sensing element comprises a thermally sensitive resistor, wherein the resistance of the resistor is dependent on, and changes in response to, changes in temperature.

9. The heater according to claim 2, wherein the temperature-sensing element comprises a temperature measuring integrated circuit.

10. The heater according to claim 1, wherein the heating element comprises a resistor.

11. The heater according to claim 1, wherein the heating element is located adjacent, at or near the aperture.

12. The heater according to claim 1, wherein the board is a printed circuit board.

13. The heater according to claim 12, wherein the board has a glass-transition temperature (Tg) that is greater than or equal to about 120° C., greater than or equal to about 130° C., greater than or equal to about 140° C., or greater than or equal to about 150° C.

14. The heater according to claim 1, wherein the board has a thickness of about 0.2 mm to about 2.3 mm, about 0.4 mm to about 2.0 mm, about 0.5 mm to about 1.6 mm, about 0.6 mm to about 1.6 mm, about 0.8 mm to about 1.5 mm, about 1.0 mm to about 1.5 mm, or about 1.2 mm.

15. The heater according to claim 1, wherein the or each via is at least partly filled with a thermally conductive material.

16. The heater according to claim 1, wherein the heat-spreading layer comprises:
- a plurality of heat-spreading sections configured to radiate heat towards a cover of a reaction vessel, each heat-spreading section being arranged on a corresponding section on the front face of the board;
- the at least one heating element comprises, for each heat-spreading section, at least one respective heating element configured to output heat to the heat-spreading section, the heating element being arranged on the back face of the board;
- each heat-spreading section being in thermal communication with the respective heating element by at least one respective heating via through the board; and
- the heating element(s) of at least one section of the plurality of sections are independently controlled or controllable relative to the heating element(s) of one or more of the other section(s) to independently control the temperature of the at least one heat-spreading section relative to the one or more other heat-spreading sections, wherein each heat-spreading section is substantially thermally insulated from the another heat-spreading section(s) to at least inhibit thermal transfer by conduction between the each heat-spreading section and another heat-spreading section(s).

17. An apparatus for detecting molecule(s), the apparatus comprising:
- a heater according to claim 1;
- a reaction vessel holder for receipt of at least one reaction vessel; and
- a controller coupled to the heating element(s) and configured to control the heat output of the heating element(s) based at least partly on a sensed temperature (s).

18. The apparatus according to claim 17, wherein the controller is configured to independently control the heating element(s) of one or more sections of the heat-spreading layer relative to the heating element(s) of one or more of the other section(s) based at least partly on a sensed temperature(s).

19. The apparatus according to claim 17, wherein the apparatus comprises:
- at least one substantially transparent or translucent cover for a reaction vessel; wherein the apparatus is arranged so that the front face of the board is located about 1 mm to about 3 mm, about 1.5 mm to about 2.5 mm, or about 2 mm, from the cover, or wherein the apparatus is arranged so that the front face of the board is located about 0 to about 1 mm from the cover.

20. The apparatus according to claim 17, wherein the apparatus is a portable apparatus.

* * * * *